(12) United States Patent
Yamaguchi

(10) Patent No.: US 10,622,371 B2
(45) Date of Patent: Apr. 14, 2020

(54) SEMICONDUCTOR DEVICE AND MANUFACTURING METHOD THEREFOR

(71) Applicant: RENESAS ELECTRONICS CORPORATION, Tokyo (JP)

(72) Inventor: Tadashi Yamaguchi, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 16/107,036

(22) Filed: Aug. 21, 2018

(65) Prior Publication Data

US 2019/0081058 A1    Mar. 14, 2019

(30) Foreign Application Priority Data

Sep. 11, 2017    (JP) .................. 2017-174357

(51) Int. Cl.
| | |
|---|---|
| *H01L 29/792* | (2006.01) |
| *H01L 27/11568* | (2017.01) |
| *H01L 27/11521* | (2017.01) |
| *H01L 27/12* | (2006.01) |
| *H01L 29/66* | (2006.01) |

(Continued)

(52) U.S. Cl.
CPC .... *H01L 27/11568* (2013.01); *G11C 16/0433* (2013.01); *H01L 21/2815* (2013.01); *H01L 21/823821* (2013.01); *H01L 21/845* (2013.01); *H01L 27/0886* (2013.01); *H01L 27/0924* (2013.01); *H01L 27/11521* (2013.01); *H01L 27/11573* (2013.01); *H01L 27/1203* (2013.01); *H01L 27/1211* (2013.01); *H01L 29/40114* (2019.08); *H01L 29/40117* (2019.08); *H01L 29/41791* (2013.01); *H01L 29/42344* (2013.01); *H01L 29/66545* (2013.01); *H01L 29/66795* (2013.01); *H01L 29/66825* (2013.01); *H01L 29/66833* (2013.01); *H01L 29/785* (2013.01); *H01L 29/7853* (2013.01); *H01L 29/792* (2013.01)

(58) Field of Classification Search
CPC ............... H01L 21/845; H01L 27/1211; H01L 29/41791; H01L 29/66795; H01L 29/785; H01L 27/11211; H01L 27/11568; H01L 27/11573; H01L 27/1203; H01L 27/11521; H01L 29/66545; H01L 29/665; H01L 29/792; H01L 21/823821; H01L 21/2855; G11C 16/0433

See application file for complete search history.

(56) References Cited

U.S. PATENT DOCUMENTS

| | | |
|---|---|---|
| 7,504,689 B2 | 3/2009 | Hisamoto et al. |
| 8,541,297 B2 | 9/2013 | Yamaguchi et al. |

(Continued)

FOREIGN PATENT DOCUMENTS

| | | |
|---|---|---|
| JP | 2006-041354 A | 2/2006 |
| JP | 2011-210790 A | 10/2011 |

*Primary Examiner* — Caridad Everhart

(74) *Attorney, Agent, or Firm* — McDermott Will & Emery LLP

(57) ABSTRACT

A memory gate electrode and a control gate electrode are formed to cover a fin projecting from the upper surface of a semiconductor substrate. A part of the fin which is covered by the memory gate electrode and the control gate electrode is sandwiched by a silicide layer as a part of a source region and a drain region of a memory cell. This silicide layer is formed as a silicide layer.

18 Claims, 29 Drawing Sheets

(51) Int. Cl.
  *G11C 16/04* (2006.01)
  *H01L 21/28* (2006.01)
  *H01L 21/8238* (2006.01)
  *H01L 29/417* (2006.01)
  *H01L 29/78* (2006.01)
  *H01L 27/11573* (2017.01)
  *H01L 27/088* (2006.01)
  *H01L 27/092* (2006.01)
  *H01L 21/84* (2006.01)
  *H01L 29/423* (2006.01)

(56) References Cited

U.S. PATENT DOCUMENTS

| | | | |
|---|---|---|---|
| 2007/0075372 A1* | 4/2007 | Terashima | H01L 29/42392 257/360 |
| 2011/0001169 A1* | 1/2011 | Ozcan | H01L 21/28518 257/213 |
| 2012/0306002 A1* | 12/2012 | Yeh | H01L 29/66795 257/327 |
| 2015/0108432 A1* | 4/2015 | Toh | H01L 29/785 257/29 |
| 2017/0018464 A1* | 1/2017 | Kim | H01L 21/823871 |

* cited by examiner

| OPERATION \ APPLIED VOLTAGE | Vd | Vcg | Vmg | Vs | Vb |
|---|---|---|---|---|---|
| WRITE | Vdd | 1V | 12V | 6V | 0 |
| ERASE | 0 | 0 | -6V | 6V | 0 |
| READ | Vdd | Vdd | 0 | 0 | 0 |

Vdd = 1.5V

SEMICONDUCTOR DEVICE AND MANUFACTURING METHOD THEREFOR

CROSS-REFERENCE TO RELATED APPLICATIONS

The disclosure of Japanese Patent Application No. 2017-174357 filed on Sep. 11, 2017 including the specification, drawings and abstract is incorporated herein by reference in its entirety.

BACKGROUND

The present invention relates to a semiconductor device and a manufacturing method therefor, and, more particularly, to an effective technique applicable to a semiconductor device including a fin transistor.

The fin transistor is known as a field effect transistor, which has a high operation speed, and can reduce the leakage current and consumption power and can realize miniaturization of the semiconductor element. The fin transistor (FINFET: FIN Field Effect Transistor) is a semiconductor element, having, for example, a semiconductor layer which projects over the semiconductor substrate as a channel region and having a gate electrode which is formed across and over the projecting semiconductor layer.

As an electrically writable and erasable non-volatile memory, a flash memory and an EEPROM (Electrically Erasable and Programmable Read Only Memory) are widely used. These memory units have, below the gate electrode MISFET (Metal Insulator Semiconductor Field Effect Transistor), a conductive floating gate electrode surrounded by an oxide film or a trap insulating film, assume a charge storage state in the floating gate or the trap insulating film as storage information, and read it as a threshold value of the transistor. This trap insulating film represents a charge storage insulating film, and is, for example, a silicon nitride film. Injection and discharge of charges to and from this charge storage layer cause the threshold value of the MISFET to shift, and cause it to operate as a storage element. This flash memory is also called a MONOS (Metal-Oxide-Nitride-Oxide-Semiconductor) transistor. The MONOS transistor is used as a transistor for memory. Further, a split gate-type memory cell with a transistor for controlled added thereto is widely used.

U.S. Unexamined Patent Application Publication No. 2011/0001169 discloses a technique for forming a silicide layer on a surface of the fin, in the FINFET.

Japanese Unexamined Patent Application Publication No. 2011-210790 discloses a technique for suppressing abnormal growth of a silicide layer, by performing a heating process twice to form the silicide layer covering the surface of a source region and the surface of a drain region.

Japanese Unexamined Patent Application Publication No. 2006-041354 discloses a technique for forming a silicide layer covering the surface of the fin, when a split gate-type memory cell including a MONOS transistor is configured with a FINFET structure.

SUMMARY

To improve the performance of the semiconductor device, the present inventors have examined to reduce the time for rewriting a memory cell by improving injection efficiency of electrons, when an SSI (Source Side Injection) method is adopted for writing for a non-volatile memory cell, as disclosed in Japanese Unexamined Patent Application Publication No. 2006-041354. Particularly, the present inventors have examined the relationship between a silicide layer formed in the source region and the drain region and injection efficiency of electrons, when a non-volatile memory with a FINFET structure is formed.

Any other objects and new features will be apparent from the descriptions of the present specification and the accompanying drawings.

Of preferred embodiments as will be described in the present application, the typical embodiments are briefly described as follows.

According to an embodiment, there is provided a semiconductor device having: a first projecting unit which is a part of a semiconductor substrate, projects from an upper surface of the semiconductor substrate, and extends in a first direction along a main surface of the semiconductor substrate; and a first gate electrode which extends in a second direction orthogonal to the first direction, and is formed to cover an upper surface and a side surface of a first part of the first projecting unit through a first gate insulating film. The semiconductor device has a first silicide layer forming a part of a first source region and a second silicide layer forming a part of a first drain region which are formed in a manner that the first part is sandwiched therebetween in the first direction.

According to an embodiment, there is provided a manufacturing method for a semiconductor device, having the steps of: (a) retreating apart of an upper surface of a semiconductor substrate, thereby forming a first projecting unit which is a part of the semiconductor substrate, and projects from the retreated upper surface of the semiconductor substrate, and extends in a first direction along a main surface of the semiconductor substrate; and (b) forming a first gate electrode to extend in a second direction orthogonal to the first direction, and to cover an upper surface and a side surface of a first part of the first projecting unit through a first gate insulating film. The manufacturing method for a semiconductor device has the step of (c) forming a first silicide layer forming a part of a first source region and a second silicide layer forming a part of a first drain region in a manner that the first part is sandwiched therebetween in the first direction.

According to an embodiment, it is possible to improve reliability of the semiconductor device.

DETAILED DESCRIPTION

In the following preferred embodiments, if necessary for convenience sake, descriptions will be made to divided plural sections or preferred embodiments, however, unless otherwise specified, they are not mutually irrelevant, but one is in relations of modifications, details, supplementary explanations of a part or whole of the other. In the following preferred embodiments, in the case of reference to the number of elements (including the quantity, numeric value, amount, range), unless otherwise specified and unless clearly limited in principle, the present invention is not limited to the specified number, and a number over or below the specified one may be used. Further, in the following preferred embodiments, the constituent elements (including the element steps) are not necessarily indispensable, unless otherwise specified and unless considered that they are obviously required in principle. Similarly, in the preferred embodiments below, when referring to the forms, positions, and relations of the constituent elements, unless otherwise specified and unless considered that they are obviously not required in principle, substantially, those approximating or similar to the forms may be included. The same applies to the numeric value and the range.

Descriptions will now specifically be made to the preferred embodiments of the present invention based on the illustrations. In the entire drawings for explaining the preferred embodiments, the same constituent elements having the same function are identified by the same reference symbols, and thus may not be described over and over. In the preferred embodiments below, unless otherwise required, substantially, the same or similar parts are not described over and over.

In any of the drawings for use in the preferred embodiments, for the sake of clear illustrations, hatching may not be provided.

First Embodiment

Figure 1:
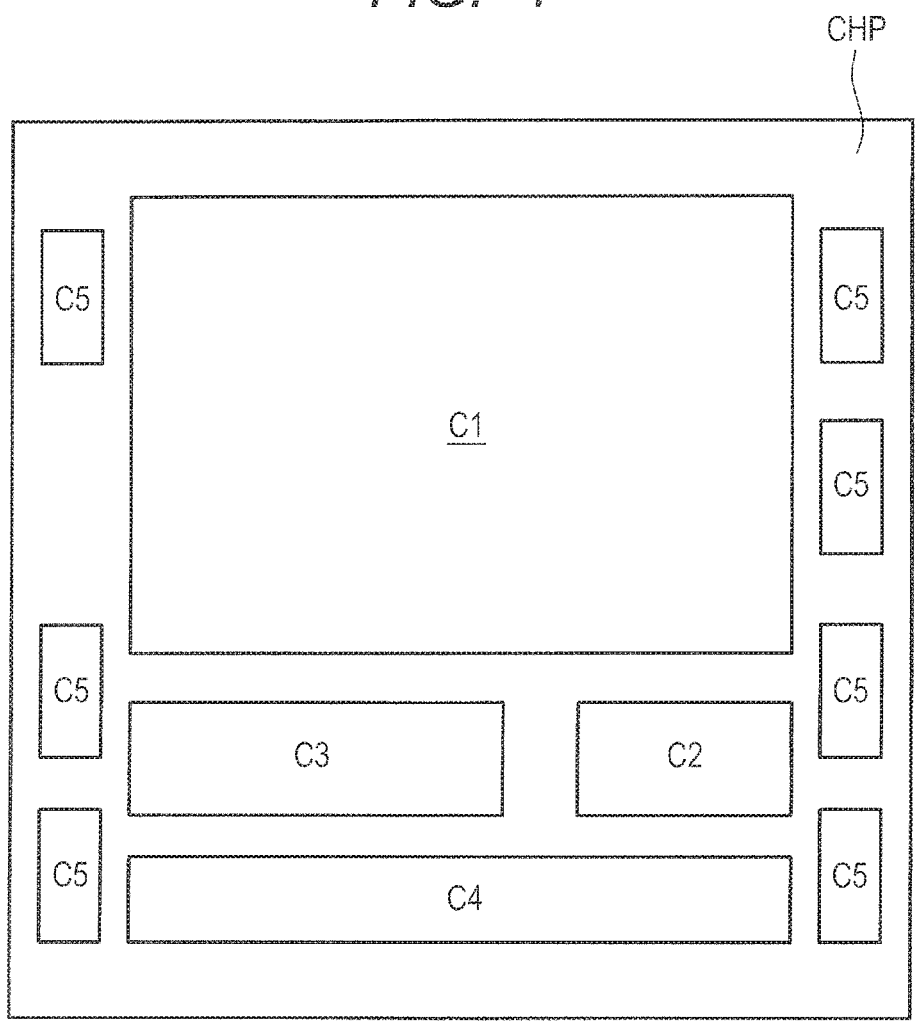
FIG. 1 is a schematic diagram illustrating a layout configuration of a semiconductor chip according to a first embodiment.

In this embodiment, descriptions will now be made to a semiconductor device having a non-volatile memory, by reference to the accompanying drawings. Descriptions will first be made to a layout configuration of the semiconductor device (a semiconductor chip) in which a system including the non-volatile memory is formed. FIG. 1 is a schematic diagram illustrating an example of a layout configuration of a semiconductor chip CHP in this embodiment. In FIG. 1, the semiconductor chip CHP has a non-volatile memory circuit C1, a CPU (Central Processing Unit) circuit C2, a RAM (Random Access Memory) circuit C3, an analog circuit C4, and an I/O (Input/Output) circuit C5.

The non-volatile memory circuit C1 has an EEPROM (Electrically Erasable Programmable Read Only Memory) and a flash memory which can electrically rewrite storage information, and is a region in which, for example, a MONOS transistor is formed, as a semiconductor element.

The CPU circuit C2 has a logic circuit which is driven by a voltage of approximately 1.5V, and is a region with a low breakdown voltage MISFET formed as a semiconductor element having low resistance and high operation speed.

The RAM circuit C3 has an SRAM (Static RAM), and is a region with a low breakdown voltage MISFET formed as a semiconductor element, having the same structure as that of the CPU circuit C2.

The analog circuit C4 has an analog circuit, and is a region having a middle breakdown voltage MISFET, a capacitive element, a resistance element, and a bipolar transistor, as semiconductor elements. The middle breakdown voltage MISFET has a breakdown voltage greater than that of the low breakdown voltage MISFET, and is driven by a voltage of approximately 6 V.

The I/O circuit C5 has an input/output circuit, and is a region with a middle breakdown voltage MISFET formed as a semiconductor element approximately the same as the analog circuit C4.

<Device Structure of Semiconductor Device>

Figure 2:
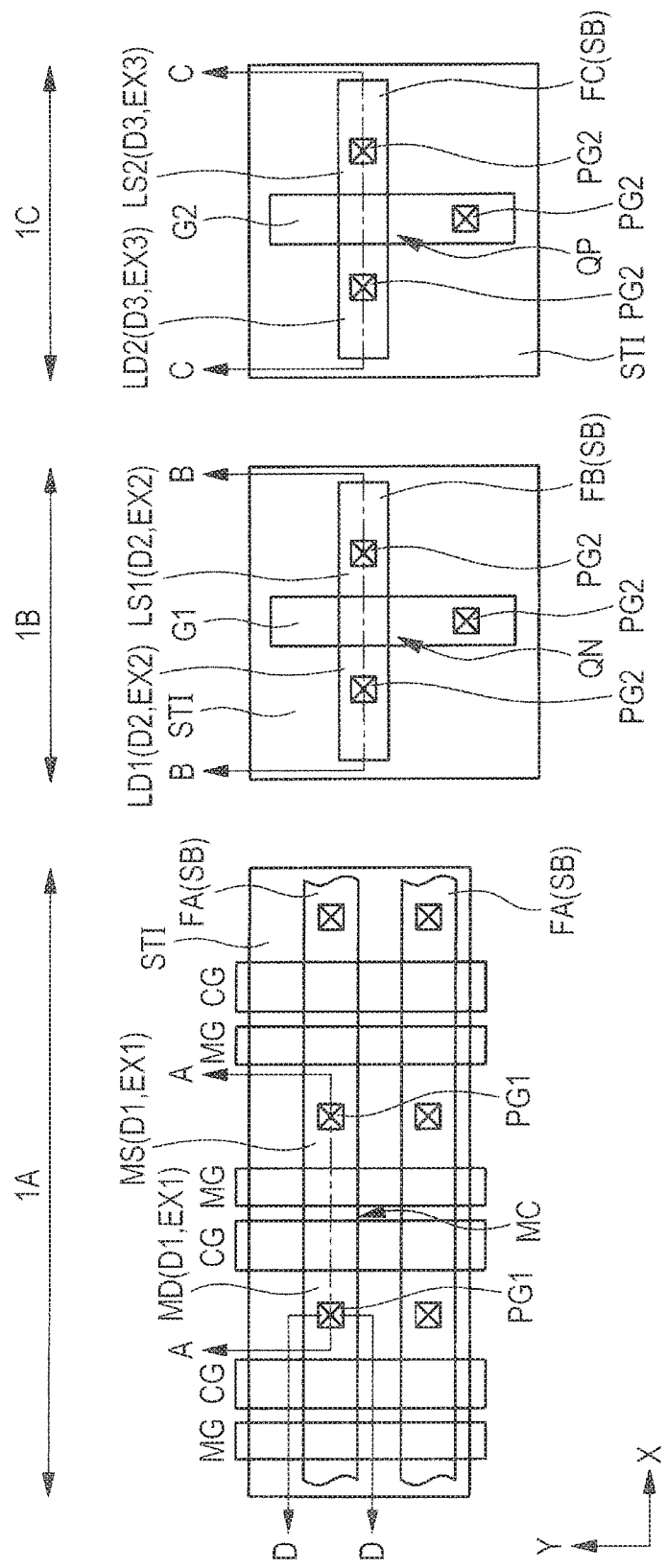
FIG. 2 is a plan view illustrating a semiconductor device according to the first embodiment.
Figure 3:
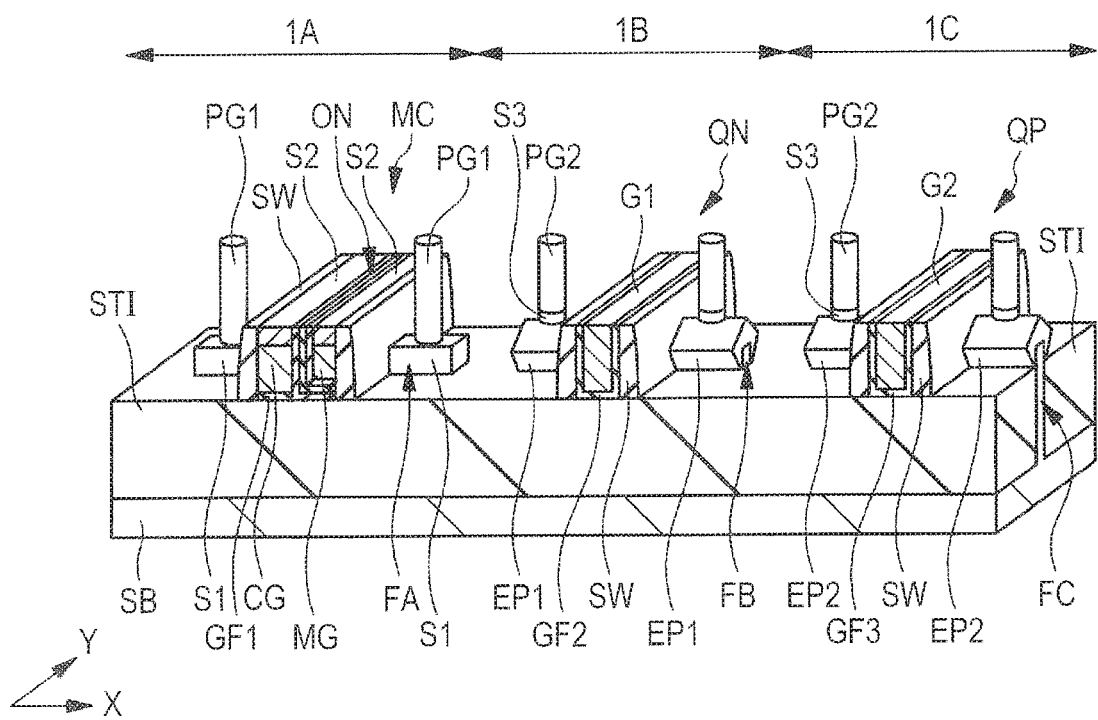
FIG. 3 is a perspective view illustrating the semiconductor device according to the first embodiment.
Figure 4:
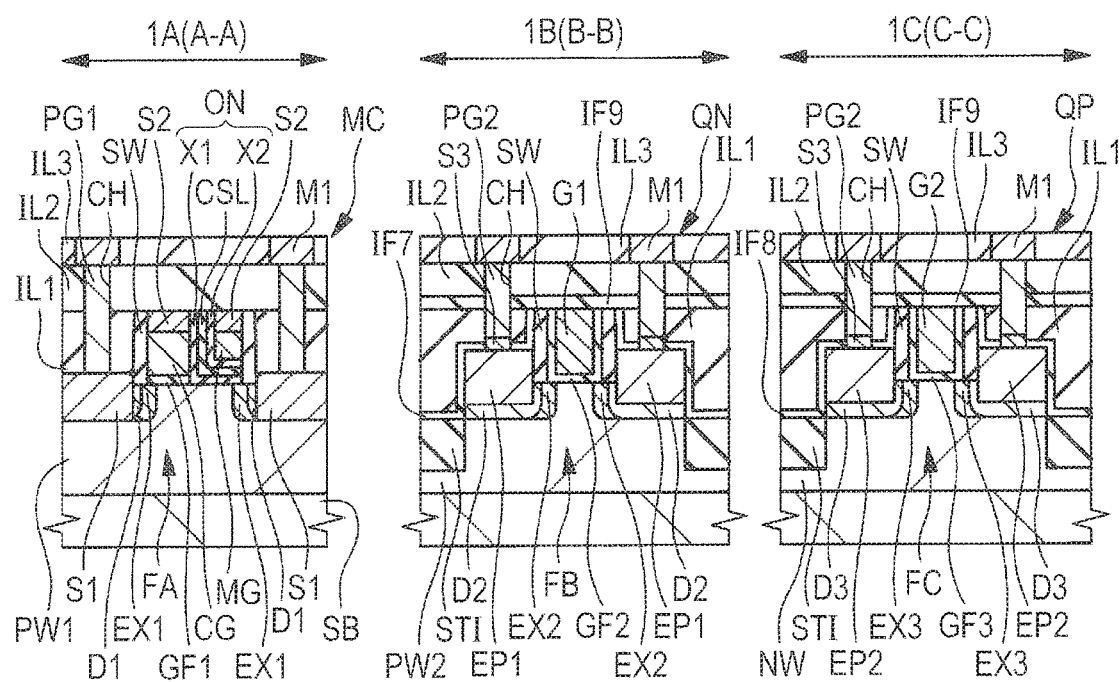
FIG. 4 is a cross sectional view illustrating the semiconductor device according to the first embodiment.

Descriptions will now be made to a structure of this embodiment, using FIG. 2 to FIG. 4. FIG. 2 is a plan view illustrating the semiconductor device of this embodiment. FIG. 3 is a perspective view illustrating the semiconductor device according to this embodiment. FIG. 4 is a cross sectional view illustrating the semiconductor device according to this embodiment. FIG. 3 does not illustrate a well.

In FIG. 2 and FIG. 3, of the semiconductor device, a region 1A is apart of the non-volatile memory circuit C1 of FIG. 1, a region 1B, and a region 1C are parts of the CPU circuit C2, of the semiconductor device.

FIG. 2 is a plan view illustrating a plurality of memory cells MC in the region 1A, an n-type transistor QN in the region 1B, and a p-type transistor QP in the region 1C.

FIG. 3 is a perspective view illustrating one memory cell MC in the region 1A, the n-type transistor QN in the region 1B, and the p-type transistor QP in the region 1C.

As illustrated in FIG. 2 and FIG. 3, in the region 1A, a plurality of fins FA extending in the direction "X" are arranged at equal intervals in the direction "Y". The direction "X" and the direction "Y" are formed along the main surface of the semiconductor substrate SB. The direction "X" is orthogonal to the direction "Y". The direction "X" is the long-side direction of the fin FA, and the direction "Y" is the short-side direction of the fin FA. The fin FA is a rectangular parallelepiped projecting part (protruding part) selectively projecting, for example, from the main surface of the semiconductor substrate SB, and has a wall-like form (plate-like form). The lower end part of the fin FA is enclosed by an element isolation part STI covering the main surface of the semiconductor substrate SB. The fin FA is a part of the semiconductor substrate SB, and is an active region for forming the memory cell MC. In plan view, the adjacent fins FA are isolated by the element isolation part STI.

In the region 1B, a fin FB extending in the direction "X" is formed. In the region 1C, a fin FC extending in the direction "X" is formed. That is, the direction "X" is the long-side direction of the fin FB and the FC, while the direction "Y" is the short-side direction of the fin FB and the fin FC. The fin FB and the fin FC are rectangular parallelepiped projecting parts (protruding part) selectively projecting from the main surface of the semiconductor substrate SB, and have a wall-like form (plate-like) form. The lower end part of the fin FB and the fin FC is enclosed by the element isolation part STI covering the main surface of the semiconductor substrate SB. The fin FB is a part of the semiconductor substrate SB, and is an active region for forming the n-type transistor QN. The fin FC is a part of the semiconductor substrate SB, and is an active region for forming the p-type transistor QP.

It is not necessary that the fin FA, the fin FB, and the fin FC are formed in a parallelepiped shape. In a cross sectional view along the short-side direction, the rectangular corner parts may be rounded. The side surface of the fin FA, the fin FB, and the fin FC may be vertical to the main surface of the semiconductor substrate SB, but it may have an inclination angle close to the vertical angle. That is, in a cross sectional view, the fin FA, the fin FB, and the fin FC may be ether in a parallelepiped shape or a trapezoidal shape.

On the plurality of fins FA, a plurality of control gate electrodes CG and a plurality of memory gate electrodes MG extending in the direction "Y" are arranged. That is, the control gate electrode CG and the plurality of memory gate electrodes MG cover the upper surface and the side surface of the fin FA, and are formed also on the element isolation part STI, through the gate insulating film GF1 and a gate insulating film ON.

The drain region MD on the side of the control gate electrode CG and the source region MS on the side of the memory gate electrode are formed in a manner that the part of the fin FA covered by the control gate electrode CG and the memory gate electrode MG is sandwiched therebetween in the direction "X". That is, in the direction "X", one control gate electrode CG and one memory gate electrode MG are positioned between the source region MS and the drain region MD.

The memory cell MC is a MISFET and a non-volatile memory element. The MISFET has the control gate electrode CG, the gate insulating film GF1, the memory gate electrode MG, the gate insulating film ON, the drain region MD, and the source region MS.

The drain region MD is formed between the two control gate electrodes CG which are adjacent to each other in the direction "X". The source region MS is formed between the two memory gate electrodes MG which are adjacent to each other in the direction "X". The two memory cells MC which are adjacent to each other in the direction "X" share the drain region MD or the source region MS. The two memory cells MC sharing the drain region MD are in line symmetry in the direction "X" with the drain region MD as an axis. The two memory cells sharing the source region MS are in line symmetry in the direction "X" with the source region MS as an axis.

On the fin FB, a gate electrode G1 extending in the direction "Y" is arranged. That is, the gate electrode G1 is formed on the upper surface and the side surface of the fin FB and on the element isolation part STI part STI, through a gate insulating film GF2. A drain region LD1 and a source region LS1 are formed in a manner that a part of the fin FB which is covered by the gate electrode G1 of the fin FB is sandwiched therebetween in the direction "X". The drain region LD1 and the source region LS1 are n-type conductive semiconductor regions.

The side surface and the upper surface of the fin FB including the drain region LD1 and the source region LS1 are covered by an epitaxial (semiconductor layer) EP1 which has been formed using an epitaxial growth process. The epitaxial layer EP1 has a rhomboid shape in cross section along the direction "Y", and a part of the epitaxial layer EP1 is formed also on the element isolation part STI. That is, the side surface of the epitaxial layer EP1, and the surface which is not in contact with the fin FB has the lower side surface and the upper side surface. The lower side surface has the inclination separating from the fin FB in the direction along the main surface of the semiconductor substrate SB, upward from the side of the element isolation part STI, while the upper side surface has the inclination approaching the fin FB in the direction along the main surface of the semiconductor substrate SB, upward from the side of the element isolation part STI. The upper end of the lower side surface and the lower end of the upper side surface are coupled to each other.

In other words, the width between the left terminal end and the right terminal end of the epitaxial layer EP1 has a greater center part between the upper end and the lower end, than the upper end and the lower end of the epitaxial layer EP1, in the direction Y.

This epitaxial layer EP1 is formed from, for example, SiP (silicon phosphorus) or SiC (silicon carbide).

The n-type transistor QN is a MISFET having a gate electrode G1, a gate insulating film GF2, a drain region LD1, and a source region LS1.

On the fin FC, the gate electrode G2 extending in the direction Y is arranged. That is, the gate electrode G2 covers the upper surface and the side surface of the fin FC, through a gate insulating film GF3, and is formed also on the element isolation part STI. A drain region LD2 and a source region LS2 are formed in a manner that the part of the fin FC covered by the gate electrode G2 is sandwiched therebetween in the direction X. The drain region LD2 and the source region LD2 are semiconductor regions having p-type conductivity.

The side surface and the upper surface of the fin FC including the drain region LD2 and the source region LS2 is covered by an epitaxial layer (semiconductor layer) EP2 formed, using an epitaxial growth process. The epitaxial layer EP2 has a rhomboid shape in cross section along the direction "Y", and a part of the epitaxial layer EP2 is formed also on the element isolation part STI. That is, the side surface of the epitaxial layer EP2 which is not in contact with the fin FC has the lower side surface and the upper side surface. The lower side surface has the inclination separating from the fin FC in the direction along the main surface of the semiconductor substrate SB, upward from the element isolation part STI, while the upper side surface has the inclination approaching the fin FC in the direction along the main surface of the semiconductor substrate SB, upward from the element isolation part STI. The upper end of the lower side surface and the lower end of the upper side surface are coupled to each other.

In other words, the width between the left terminal end and the right terminal end of the epitaxial layer EP2 has a greater center part between the upper end and the lower end, than the upper end and the lower end of the epitaxial layer EP2, in the direction "Y".

This epitaxial layer EP2 is formed from, for example, SiGe (silicon germanium).

The p-type transistor QP is a MISFET having a gate electrode G2, the gate insulating film GF3, a drain region LD2, and a source region LS2.

On each of the memory cells MC and the n-type transistor QN and the p-type transistor QP, interlayer insulating films IL1 and IL2 are formed. In the interlayer insulating films IL1 and IL2, plugs PG1 and PG2 are formed. In FIG. 2 and FIG. 3, the interlayer insulating films IL1 and IL2 are not illustrated. The drain region MD and the source region MS of each of the memory cells MC are electrically coupled to wiring M1 as a bit line and wiring M1 as a source line, respectively through the plugs PG1. The drain region LD1 and the source region LS1 of the n-type transistor QN, and the drain region LD2 and the source region LS2 of the p-type transistor QP are electrically coupled to the wiring M1, through a plug PG2.

Descriptions will now be made to a cross sectional structure of the semiconductor device according to this embodiment, using FIG. 4.

A region 1A of FIG. 4 shows a cross sectional view taken along a line A-A of FIG. 2, and shows a cross sectional view along a gate length direction (direction "X") of the memory cell MC.

A region 1B of FIG. 4 is illustrated in cross sectional view taken along a line B-B of FIG. 2, and is illustrated in cross sectional view along a gate length direction (direction "X") of the n-type transistor QN.

A region 1C of FIG. 4 is illustrated in cross sectional view taken along a line C-C of FIG. 2, and is illustrated in cross sectional view along a gate length direction (direction "X") of the p-type transistor QP.

As illustrated in FIG. 4, in the semiconductor substrate SB including the fin FA, a well PW1 as a p-type conductive semiconductor region is formed. In the semiconductor substrate SB including the fin FB, a well PW2 as a p-type conductive semiconductor region is formed. In the semiconductor substrate including the fin FC, a well NW as an n-type conductive semiconductor region is formed.

Descriptions will now be made to a structure of the memory cell MC included in the regions 1A.

As shown in the region 1A, in the upper part of the fin FA projecting from the element isolation part STI, the control gate electrode CG is formed on the upper surface of the fin FA through the gate insulating film GF1. In the region adjacent to the control gate electrode CG in the direction "X", the memory gate electrode MG is formed through the insulating film ON. The insulating film ON intervenes between the control gate electrode CG and the memory gate electrode MG. The control gate electrode CG and the memory gate electrode MG are electrically separated by the insulating film ON. The insulating film ON is continuously formed to cover one side surface and the bottom surface of the memory gate electrode MG.

The gate insulating film GF1 is an insulating film formed from, for example, silicon oxide. The gate insulating film GF1 may be formed from a so-called high dielectric constant film (High-k film), as a high insulating material film having a dielectric constant greater than silicon oxide. This high dielectric constant film is formed from a metal oxide film, for example, an oxide film including hafnium, an oxide film including aluminum, or an oxide film including tantalum. The gate insulating film GF1 has a thickness of, for example, 1 to 2 nm.

The control gate electrode CG is, for example, a conductive film formed from polycrystalline silicon having n-type conductivity.

The insulating film ON is a laminated film of an insulating film X1, a charge storage layer CSL formed on the insulating film X1, and an insulating film X2 formed on the charge storage layer CSL. The insulating film X1 is, for example, a silicon oxide film formed by performing thermal oxidation for the upper surface and the side surface of the fin FA, and has a thickness of 4 nm. The charge storage layer CSL is a trap insulating film which can hold charges, is a silicon nitride film which has been formed using, for example, a CVD (Chemical Vapor Deposition) technique, and has a thickness of 7 nm. The insulating film X2 is a silicon oxide film or a silicon oxynitride film, and has a thickness of 9 nm. That is, the insulating film ON has a thickness of, for example, 20 nm, which is greater than that of the gate insulating film GF1 below the control gate electrode CG.

The charge storage layer CSL may be formed from an insulating film which has been formed by nitriding hafnium or aluminum, instead of a silicon nitride film.

The memory gate electrode MG is, for example, a conductive film formed from a polycrystalline silicon film having n-type conductivity.

A silicide layer S2 is formed on the control gate electrode and on the memory gate electrode MG. The silicide layer S2 is formed from, for example, nickel silicide (NiSi) or cobalt silicide ($CoSi_2$). To the silicide layer S2, platinum (Pt) may be added.

The side surface of a pattern is covered by the sidewall spacer SW. This pattern includes the control gate electrode CG, the gate insulating film GF1, the memory gate electrode MG, the insulating film ON, and the silicide layer S2. The sidewall spacer SW is formed from a laminated structure of, for example, a silicon nitride film and a silicon oxide film.

In the fin FA of the region 1A, the source region MS and the drain region MD of the memory cell MC illustrated in FIG. 2 and FIG. 3 are formed in a manner that the part of the fin FA which is covered by the control gate electrode CG and the memory gate electrode MG is sandwiched therebetween in the direction X. The source region MS and the drain region MD have an extension region EX1 as an $n^-$-type semiconductor region, a diffusion region D1 as an n-type semiconductor region, and a silicide layer S1, as illustrated in the region 1A of FIG. 4. The diffusion region D1 has an impurity concentration greater than that of the extension region EX1. The extension region EX1 and the diffusion region D1 are in contact with each other. The extension region EX1 is positioned on the side of the channel region of the memory cell MC, closer than the diffusion region D1 and the silicide layer S1. In this embodiment, the diffusion region D1 is formed as a part of the source region MS and the drain region MD. However, the diffusion region D1 is not necessarily formed.

The silicide layer S1 in this embodiment is formed not only on the surface of the fin FA, but also inside the fin FA, and is formed as a so-called full-silicide layer. That is, the fin FA as the source region MS and the drain region MD are full-silicided. In other words, of the fin FA, any of the parts upper than the upper surface of the element isolation part STI are nearly fully silicided. Specifically, of the fin FA, 90% of the parts upper than the upper surface of the element isolation part STI are silicided, and are formed as a silicide layer S1. Thus, 90% or more of the source region MS and the drain region MD is formed from the silicide layer S1, and less than 10% of the source region MS and the drain region MD is formed from the semiconductor region including the extension region EX1. This results in improving injection efficiency of hot electrons to the charge storage layer CSL, during the writing operation for the memory cell MC, thus reducing the rewriting time for the memory cell.

In this embodiment, for the purpose of suppressing overgrowth of the silicide layer S1, carbon or nitrogen is introduced into the silicide layer S1 or the fin FA including the extension region EX1.

This silicide layer S1 is formed from a film including nickel (Ni) and silicon (Si), and formed from, for example, nickel silicide (Nisi).

A formation method for the silicide layer S1 will more specifically be described later, using FIG. 45 to FIG. 47 as cross sectional views taken along the direction "Y" of the fin FA.

The interlayer insulating film IL1 formed from, for example, a silicon oxide film is formed on the fin FA and the element isolation part STI. An etching stopper film formed from, for example, a silicon nitride film may be formed between the fin FA and the interlayer insulating film IL1. The interlayer insulating film IL2 formed from, for example, a silicon oxide film is formed on the upper surface of each of the interlayer insulating film IL1, the silicide layer S2 on the control gate electrode CG, the silicide layer S2 on the memory gate electrode MG, and the sidewall spacer SW.

A contact hole CH electrically coupled to the source region MS and the drain region MD is formed in the interlayer insulating film IL2 and the interlayer insulating film IL1. The plug PG1 is formed in the contact hole CH, and is formed, for example, from a barrier metal film including, a titanium film, a titanium nitride film, or a laminated film thereof, and a conductive film mainly including tungsten.

Descriptions will now be made to a structure of the n-type transistor QN shown in the region 1B.

As shown in the region 1B, the gate insulating film GF2 is formed along the bottom surface and the side surface of the opening for exposing the fin FB between two sidewall spacers SW, in the direction "X".

The gate electrode G1 is embedded in the opening through the gate insulating film GF2. In this manner, the gate electrode G1 of this embodiment is formed with a so-called gate last structure.

The gate insulating film GF2 is formed from an insulating material film having a dielectric constant greater than that of silicon oxide, that is, formed from a high dielectric constant film (High-k film). This high dielectric constant film may, for example, be an oxide film including hafnium, an oxide film including aluminum, or an oxide film including tantalum. The gate insulating film GF2 has a thickness of, for example, 1 to 2 nm.

Thermal oxidation may be performed for the upper surface and the side surface of the fin FB to form a silicon oxide film with a thickness of 1 nm, between the gate insulating film GF2 and the fin FB.

The gate electrode G1 is formed from, for example, a single layered metal film formed from a tantalum nitride film, a titanium aluminum film, a titanium nitride film, a tungsten film or an aluminum film, or a laminated film in which any of the films are appropriately laminated.

The side surface of the pattern including the gate electrode G1 and the gate insulating film GF2 is covered by the sidewall spacer SW. The sidewall spacer SW is formed with a laminated structure of, for example, a silicon nitride film and a silicon oxide film.

In the fin FB, the source region LS1 and the drain region LD1 of the n-type transistor QN are formed in a manner that a part of the fin FB covered by the gate electrode G1 is sandwiched therebetween in the direction "X". The source region LS1 and the drain region LD1 respectively have an extension region EX2 as an n⁻-type semiconductor region and a diffusion region D2 as an n⁺-type semiconductor region. The diffusion region D2 has an impurity concentration greater than that of the extension region EX2. The extension region EX2 and the diffusion region D2 are in contact with each other, and the extension region EX2 is positioned on the side of the channel region of the n-type transistor QN, closer than the diffusion region D2.

The side surface and the upper surface of the fin FB beside the sidewall spacer SW are covered by the epitaxial layer EP1 formed using the epitaxial growth process. The above-described diffusion region D2 is formed not only in the fin FB, but also in the epitaxial layer EP1.

Descriptions will now be made to a structure of the p-type transistor QP shown in the region 1C.

As shown in the region 1C, the gate insulating film GF3 is formed along the bottom surface and the side surface of the opening for exposing the fin FC between the two sidewall spacers SW in the direction "X".

The gate electrode G2 is embedded and formed in the opening through the gate insulating film GF3. In this manner, the gate electrode G2 of this embodiment is formed with a so-called gate last structure.

The gate insulating film GF3 is formed from an insulating material film having a dielectric constant greater than that of silicon oxide, that is, formed from a high dielectric constant film (High-k film). This high dielectric constant film may, for example, be an oxide film including hafnium, an oxide film including aluminum, or an oxide film including tantalum. The gate insulating film GF3 has a thickness of, for example, 1 to 2 nm.

Thermal oxidation may be performed for the upper surface and the side surface of the fin FC to form a silicon oxide film with a thickness of approximately 1 nm, between the gate insulating film GF3 and the fin FC.

The gate electrode G2 is formed from, for example, a single layered metal film including a tantalum nitride film, a titanium aluminum film, a titanium nitride film, a tungsten film or an aluminum film, or a laminated film in which any of the films are appropriately laminated.

The side surface of the pattern including the gate electrode G2 and the gate insulating film GF3 is covered by the sidewall spacer SW. The sidewall spacer SW is formed with a laminated structure of, for example, a silicon nitride film and a silicon oxide film.

In the fin FC, the source region LS2 and the drain region LD2 of the p-type transistor QN are formed in a manner that a part of the fin FC covered by the gate electrode G2 is sandwiched therebetween in the direction "X". The source region LS2 and the drain region LD2 have an extension region EX3 as a p⁻-type semiconductor region and a diffusion region D3 as a p⁺-type semiconductor region. The diffusion region D3 has an impurity concentration greater than that of the extension region EX3. The extension region EX3 and the diffusion region D3 are in contact with each other, and the extension region EX3 is positioned on the side of the channel region of the p-type transistor QP, closer than the diffusion region D3.

The side surface and the upper surface of the fin FC beside the sidewall spacer SW are covered by the epitaxial layer EP2 formed using the epitaxial growth process. The above-described diffusion region D3 is formed not only in the fin FC, but also in the epitaxial layer EP2.

The interlayer insulating film IL1 formed from, for example, a silicon oxide film is formed on the fin FB and the fin FC. An etching stopper film formed from, for example, a silicon nitride film may be formed between the fin FA and the interlayer insulating film IL1. The interlayer insulating film IL2 formed from, for example, a silicon oxide film is formed on the upper surface of each of the interlayer insulating film IL1, the gate electrode G1, the gate electrode G2, and the sidewall spacer SW.

The contact hole CH which is electrically coupled to the source region LS1, the drain region LD1, the source region LS2, and the drain region LD2 are formed in the interlayer insulating film IL2 and the interlayer insulating film IL1. In the contact hole CH, the plug PG2 is formed. The plug PG2 is formed from a barrier metal film including, for example, a titanium film or a titanium nitride film, or a laminated film thereof, and a conductive film mainly including tungsten.

A silicide layer S3 is formed between the diffusion region D2 including the epitaxial layer EP1 and the plug PG2 and between the diffusion region D3 including the epitaxial layer EP2 and the plug PG2. The silicide layer S3 is formed from, for example, TiSi$_2$ (titanium silicide). The silicide layer S3 is formed right below the plug PG2, that is, on the bottom part of the contact hole CH. The upper surface of the epitaxial layer EP1 in the region beside the plug PG2 and the upper surface of the epitaxial layer EP2 in the region beside the plug PG2 are exposed from the silicide layer S3. The silicide layer S3 has a role of reducing coupling resistance between the epitaxial layer EP1 including the semiconductor and the plug PG2.

An interlayer insulating film IL3 is formed on the interlayer insulating film IL2 covering the memory cell MC, the n-type transistor QN, and the p-type transistor QP. A trench for wiring is formed in the interlayer insulating film IL3. In this trench for wiring, a conductive film mainly including, for example, copper is embedded, thereby forming the wiring M1 as the first layer coupled to the plugs PG1 and PG2 in the interlayer insulating film IL3. The structure of the wiring M1 as a first layer is a so-called damascene wiring structure.

After this, using a dual damascene technique, the wiring of the second layer or further layer is formed, but is not illustrated. The wiring M1 and the wiring upper than the wiring M1 are not limited to having the Damascene wiring structure. The conductive film may be patterned and formed, and, for example, the tungsten wiring or the aluminum wiring is applicable.

Descriptions will now be made to the structure of the source region and the drain region of each of the regions 1A to 1C of this embodiment.

The position of the upper surface of each of the epitaxial layers EP1 and EP2 formed in the region 1B and the region 1C, in other words, the surface coupled to the plug PG2 through the silicide layer S3 is higher than the position of the upper surface of the silicide layer S1 of the region 1A, that is, the surface coupled to the plug PG1. This is because the thickness of the epitaxial layers EP1 and EP2 formed in the fin FB or the fin FC is greater than the thickness of the silicide layer S1 formed on the fin FA.

In this manner, in this embodiment, the thick epitaxial layers EP1 and EP2 are formed, thereby increasing the cross sectional area of each of the source region LS1 and the drain region LD1 of the n-type transistor QN and also the source region LS2 and the drain region LD2 of the p-type transistor QP. This results in reducing the resistance of the source region LS1, the drain region LD1, the source region LS2, and the drain region LD2. In the region 1A, the resistance of the source region MS and the drain region MD is reduced, by covering the fin FA with using the silicide layer S1 whose resistance is lower than the semiconductor.

There is a difference in structures for lowering the resistance of the source region and the drain region between the region 1A, the region 1B, and the region 1C. This is because it is necessary to prevent occurrence of stress. That is, to lower the resistance of the source region and the drain region of the FINFET, it is considered to form the epitaxial layer covering the source region and the drain region. In the memory cell MC, stress occurs in the element, if the epitaxial layer is formed in the source region MS and the drain region MD. This results in a problem of lowering the performance and reliability of the memory unit.

In this embodiment, for the fin FA including the memory cell MC, the silicide layer S1 is formed, thereby realizing the low resistance of the sour/drain regions. For the fins FB and FC including the n-type transistor QN and the p-type transistor QP, the epitaxial layers EP1 and EP2 with a large volume are formed, thereby realizing the low resistance of the source/drain regions.

Accordingly, it is possible to realize the low resistance of the memory cell MC, the n-type transistor QN, and the p-type transistor QP, and to prevent degradation of the performance of the memory cell. Thus, the performance of the semiconductor device can be improved.

<Operations of Non-Volatile Memory>

Descriptions will now be made to an operation example of a non-volatile memory by reference to FIG. 48 and FIG. 49.

Figure 48:
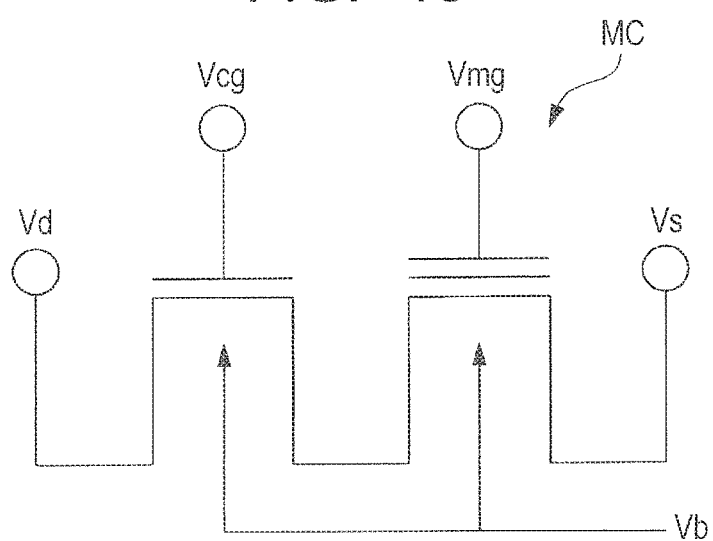
FIG. 48 is an equivalent circuit diagram of a memory cell of a non-volatile memory.

FIG. 48 is an equivalency circuit diagram of the memory cell MC of the non-volatile memory. FIG. 49 is a table representing examples of application conditions of a voltage to each part of a selected memory cell at the times of "write", "erase", and "read". The table of FIG. 49 represents a voltage Vmg to be applied to the memory gate electrode MG of the memory cell MC illustrated in FIG. 48, a voltage Vs to be applied to the source region MS, a voltage Vcg to be applied to the control gate electrode CG, a voltage Vd to be applied to the drain region MD, and a voltage Vb to be applied to the well PW1, in association with "write", "erase", and "read".

Figures 49, 50:
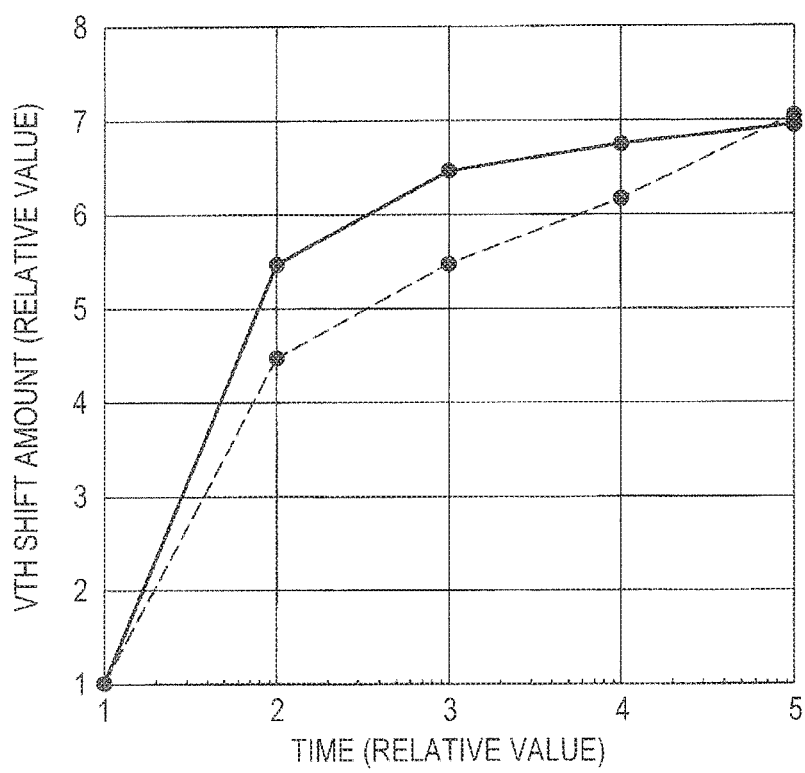
FIG. 49 is a table representing examples of application conditions of a voltage to each part of a selected memory cell at the times of "write", "erase", and "read".
FIG. 50 is a graph illustrating experimental data obtained by the present inventors.

The table of FIG. 49 represents only examples of preferable application conditions of voltages. It is not limited to these examples, and various changes are possible as necessary. In this embodiment, "write" is defined as injection of electrons to the charge storage layer CSL in the insulating film ON below the memory gate electrode MG, while "erase" is defined as injection of holes.

The write method may be a method for performing writing using hot electron injection, that is, a so-called source-side injection. For example, a voltage represented in the column of "write" of FIG. 49 is applied to each part of the selected memory cell for writing, and electrons are injected to the charge storage layer CSL of the selected memory cell, thereby performing the writing.

At this time, hot electrons are generated in a channel region below two gate electrodes (the memory gate electrode MG and the control gate electrode CG) of the fin FA, and are injected to the charge storage layer CSL below the memory gate electrode MG. The injected hot electrons are captured at a trap level in the charge storage layer CSL. As a result, the threshold voltage of the memory transistor having the memory gate electrode MG is increased. That is, the memory transistor is in a write state.

The erasure method may be a method for performing erasure by hot hole injection by BTBT (Band-To-Band Tunneling), that is, a so-called a BTBT method. That is, erasure is done by injecting the holes generated by the BTBT to the charge storage layer CSL. For example, a voltage represented in the column "erase" of FIG. 49 is applied to each part of the selected memory cell for performing erasure. Then, holes are generated by the BTBT phenomenon, and the holes are injected to the charge storage layer CSL of the selected memory cell due to electric field acceleration thereof. As a result, the threshold voltage of the memory transistor is decreased. That is, the memory transistor is in an erasure state.

At the time of reading, a voltage represented in the column "read" of FIG. 49 is applied to each part of the selected memory cell for performing reading. The voltage Vmg to be applied to the memory gate electrode MG at the time of reading is made to be a value between the threshold voltage of the memory transistor in the write state and the threshold voltage of the memory transistor in the erasure state, thereby discriminating between the write state and the erasure state.

<Main Feature of Semiconductor Device>

The main feature of the semiconductor device of this embodiment is that the silicide layer S1 formed in the source region MS and the drain region MD of the memory cell MC in the region 1A is formed as a full-silicide layer. The silicide layers S1 are formed in a manner that a part of the fin FA covered by the control gate electrode CG and the memory gate electrode MG is sandwiched therebetween in the direction "X". Specifically, as illustrated in FIG. 4 and FIG. 47, not only the surface of the fin FA, but also the internal part of the fin FA is also silicided. In addition, of the fin FA, 90% of the part upper than the uppermost surface of the element isolation part STI is formed as the silicide layer S1. Thus, 90% of the source region MS and the drain region MD is formed by the silicide layer S1. In this embodiment, this silicide layer S1 is referred to as a full-silicide layer.

In this manner, the silicide layer S1 is formed as the full-silicide layer, thereby lowering the resistance of the source region MS and the drain region MD. That is, when the silicide layer is formed only on the surface of the fin FA, the internal part of the fin FA is a semiconductor whose resistance is greater than that of the silicide layer. Then, the resistance of the source region MS and the drain region MD is high. Like the silicide layer S1 of this embodiment, not only the surface of the fin FA, but also the internal part of the fin FA is silicided, thereby enabling to lower the resistance of the source region MS and the drain region MD.

According to the examination by the present inventors, it is found that the writing time for the memory cell MC can be reduced, at the writing operation for the memory cell MC, particularly at the time of writing using the above-described SSI method, by forming the silicide layer S1 as the full-silicide layer.

This is because hot electrons over a Schottky barrier flow into the channel region, at the writing operation, as a result that the Schottky barrier is generated in the interface between the silicide layer S1 and a part (the channel region of the memory cell MC) of the fin FA which is covered by the control gate electrode CG and the memory gate electrode MG. That is, in the conventional memory cell MC, because the silicide layer is formed only on the surface of the diffusion region D1, the above-described Schottky barrier does not exist. Because the hot electros over the Schottky barrier have energy higher than those hot electrons generated in the conventional memory cells MC, they are easily captured by the charge storage layer CSL. This increases the amount of electrons injected to the charge storage layer CSL. Thus, it is possible to reduce the writing time for the memory cell MC, and to improve the writing speed for the memory cell MC. Therefore, it is possible to improve the performance of the semiconductor device.

FIG. 50 is a graph illustrating experimental data obtained by the present inventors. The vertical axis represents a change amount of a threshold voltage of the memory cell MC. If the change amount of the threshold voltage is large, it implies that a large amount of electrons are injected into the charge storage layer CSL. The horizontal axis represents the time of the writing operation. Note that the values of the vertical axis and the horizontal axis in FIG. 50 represent the relative values rather than the actual. In FIG. 50, values of the memory cell MC of this embodiment are illustrated with a solid line, while values of the conventional memory cell (the memory cell in which the silicide layer is formed only on the surface of the diffusion region D1) are illustrated with a broken line.

As obvious from the data of FIG. 50, in the memory cell MC of this embodiment, the electrons are efficiently injected into the charge storage layer CSL, as compared with the conventional memory cell.

Because it is possible to reduce the time for rewriting data in the memory cell MC, it reduces the electrical stress on the insulating film ON at every writing operation. Thus, it is possible to improve the rewriting resistance of the memory cell MC, and to improve the retention characteristics of the memory cell MC. Therefore, it is also possible to improve the reliability of the semiconductor device.

The hot electrons with high energy can reach a deep level (a position upper from the interface between the insulating film X1 and the charge storage layer CSL) in the charge storage layer CSL. This improves the holding characteristics of the electrons injected into the charge storage layer CSL. From this point of view also, it is possible to improve the retention characteristics of the memory cell MC. Thus, it is further possible to improve the reliability of the semiconductor device.

<Manufacturing Process of Semiconductor Device>

Descriptions will now be made to a manufacturing method for a semiconductor device according to this embodiment, using FIG. 5 to FIG. 47.

Descriptions will now be made to a formation process for the fin FA of the region 1A illustrated in FIG. 2, the fin FB of the region 1B, and the fin FC of the region 1C, using FIG. 5 to FIG. 18. FIG. 5, FIG. 7, FIG. 9, FIG. 11, FIG. 12, FIG. 14, and FIG. 16 are perspective views for explaining a manufacturing process for the semiconductor device of this embodiment. FIG. 6, FIG. 8, FIG. 10, FIG. 13, FIG. 15, FIG. 17, and FIG. 18 are cross sectional views of a manufacturing process for the semiconductor device of this embodiment.

Figure 5:
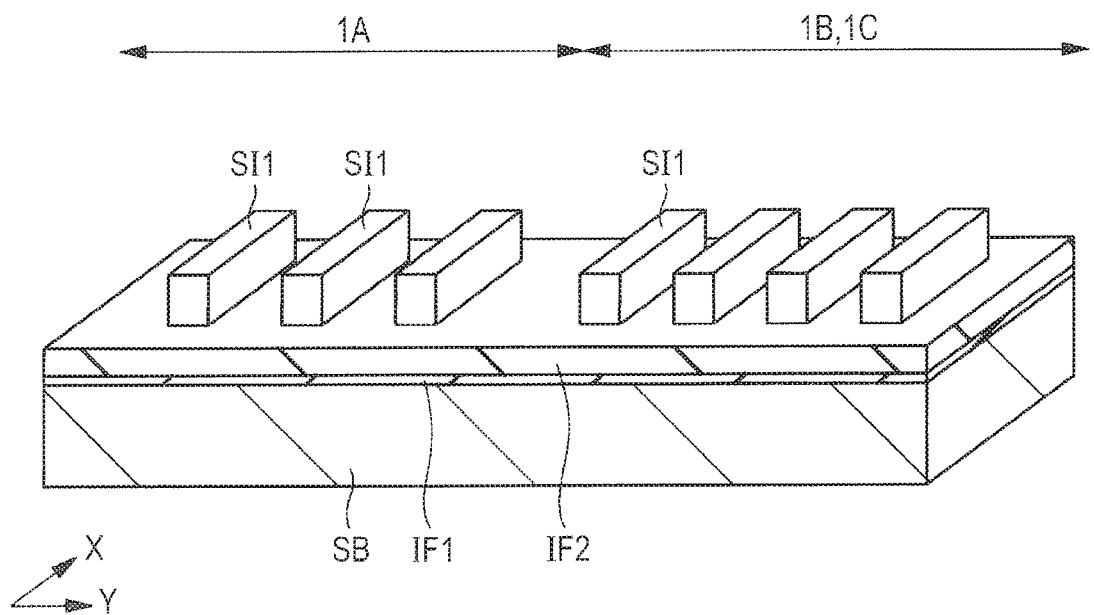
FIG. 5 is a perspective view for explaining a manufacturing process for the semiconductor device according to the first embodiment.
Figure 6:
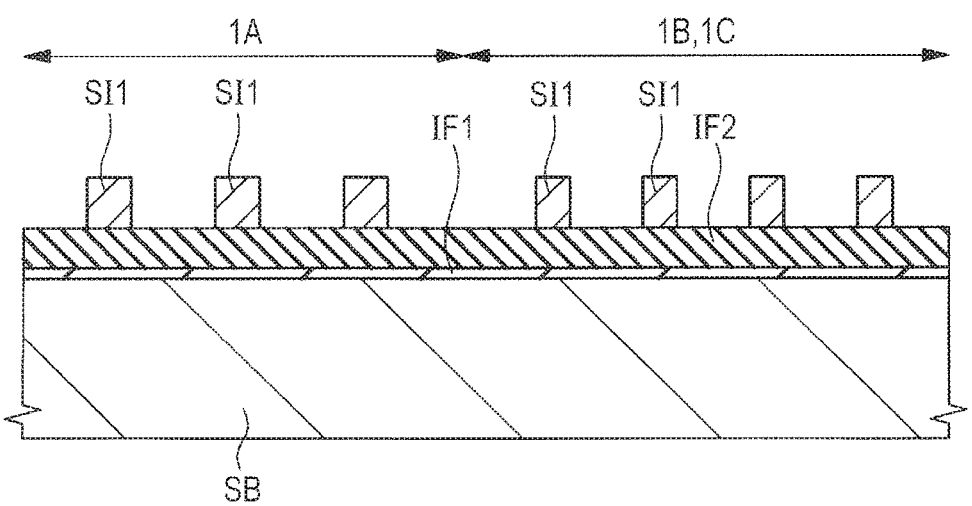
FIG. 6 is a cross sectional view along a direction "Y" of the semiconductor device in the manufacturing process, as illustrated in FIG. 5.

As illustrated in FIG. 5 and FIG. 6, a semiconductor substrate SB is prepared. Then, an insulating film IF1, an insulating film IF2, and a conductive film SI1 are sequentially formed on the main surface of the semiconductor substrate SB. The semiconductor substrate SB is formed from p-type single crystal silicon having resistivity of, for example, approximately 1 to 10 Ωcm. The insulating film IF1 is formed from, for example, a silicon oxide film, and can be formed using, for example, a thermal oxidation technique or a CVD technique. The insulating film IF1 has a thickness of 2 to 10 nm. The insulating film IF2 is formed from, for example, a silicon nitride film, using, for example, a CVD technique. The insulating film IF2 has a thickness of 20 to 100 nm. The conductive film SI1 is formed from, for example, a silicon film, using, for example, a CVD technique. The conductive film SI1 has a thickness of, for example, 20 to 200 nm. The conductive film SI1 of the region 1A and the region 1B is processed using a photolithography technique and an etching technique. As a result, a plurality of patterns of the conductive films SI1 extending in the direction "X" are formed in the direction "Y" on the insulating film IF2.

Figure 7:
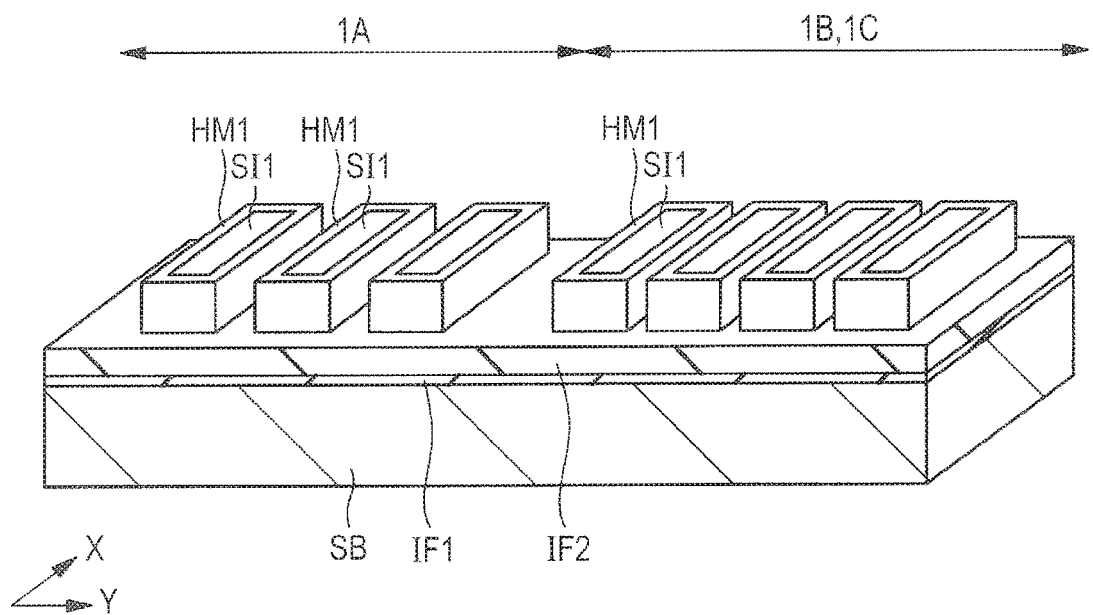
FIG. 7 is a perspective view for explaining a manufacturing process for the semiconductor device, after that of FIG. 5.
Figure 8:
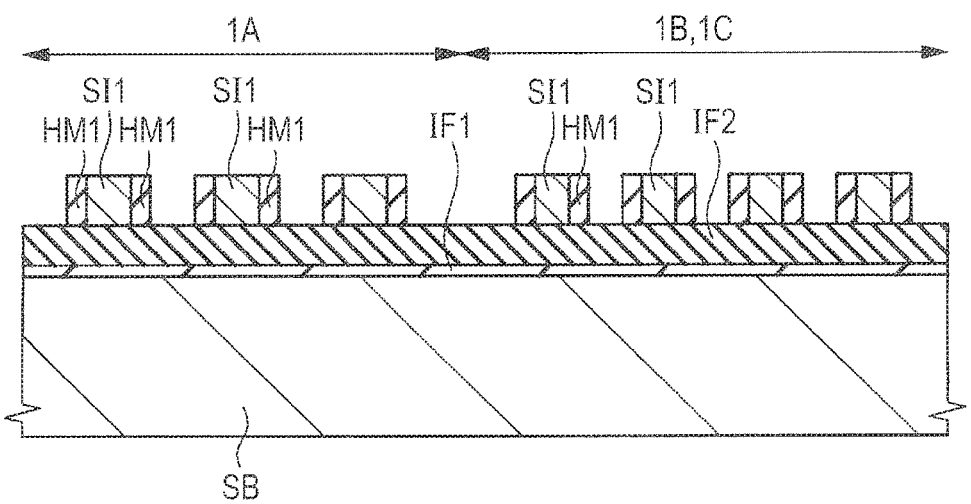
FIG. 8 is a cross sectional view along the direction "Y" of the semiconductor device in the manufacturing process, as illustrated in FIG. 7.

As illustrated in FIG. 7 and FIG. 8, a hard mask HM1 covering the side surface of each of the conductive films SI1 is formed. After a silicon oxide film having a thickness of 10 to 40 nm is formed on the semiconductor substrate SB using, for example, a CVD technique, dry etching as anisotropic etching is performed. By this, the surface of each of the insulating film IF2 and the conductive film SI1 is exposed, thereby forming the hard mask HM1 remaining on the side surface of the conductive film SI1. The hard mask HM1 is not completely embedded between the adjacent conductive films SI1, and is formed in an annular form to enclose each of the conductive films SI1.

After this, the conductive film SI1 is removed using a wet etching technique.

Figure 9:
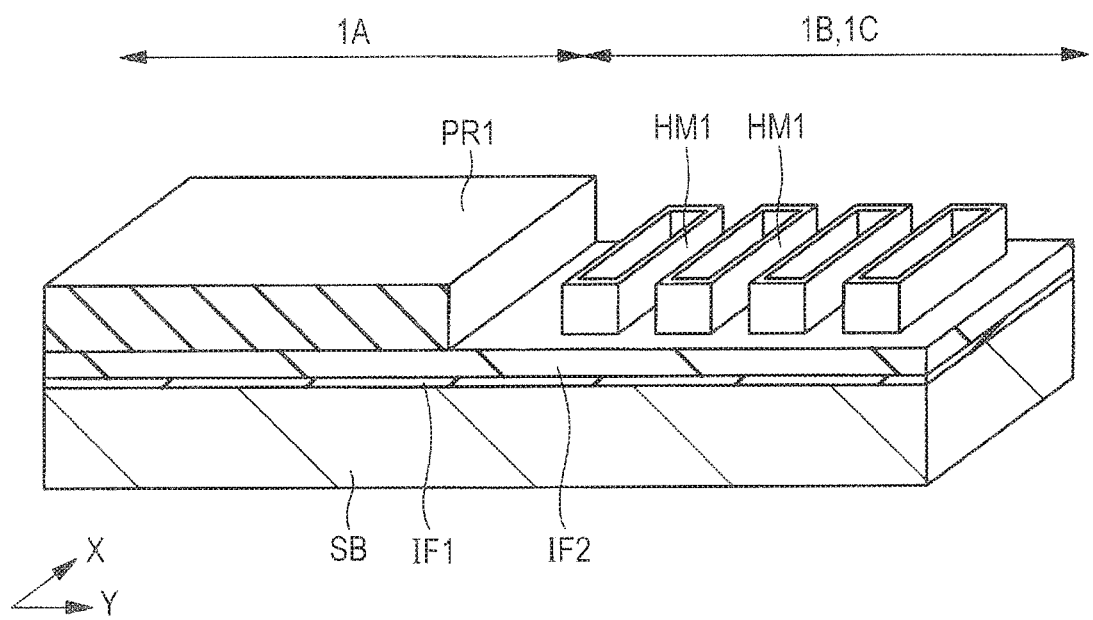
FIG. 9 is a perspective view for explaining a manufacturing process for the semiconductor device, after that of FIG. 7.
Figure 10:
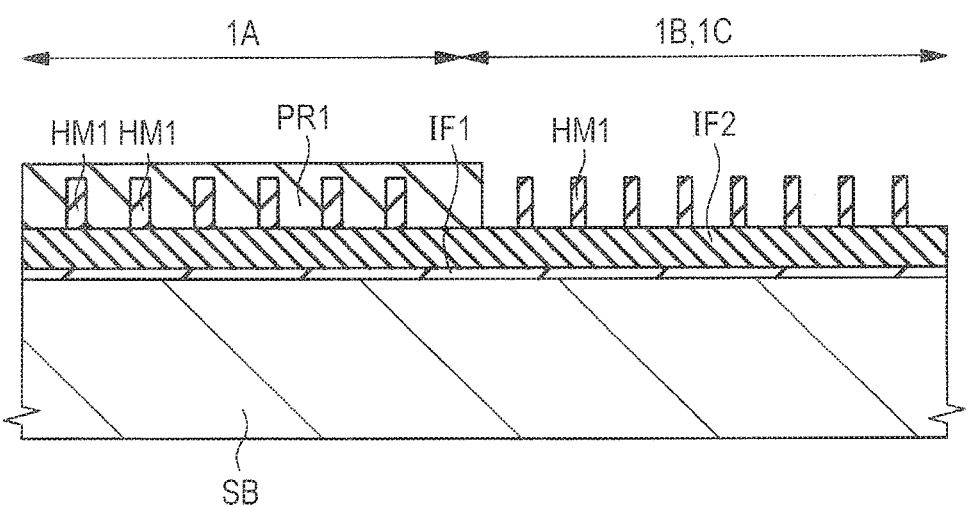
FIG. 10 is a cross sectional view along the direction "Y" of the semiconductor device in the manufacturing process illustrated in FIG. 9.

As illustrated in FIG. 9 and FIG. 10, there is formed a resist pattern PR1 covering the hard mask HM1 of the region 1A and for exposing the hard mask HM1 of the region 1B and the region 1C. Next, the wet etching is performed for removing a part of the surface of the hard mask HM1 of the region 1B and the region 1C. This results in narrowing the width of the hard mask HM1 of the region 1B and the region 1C. In this application, "width" represents the length of the pattern in a direction along the main surface of the semiconductor substrate SB.

The hard mask HM1 is used for forming the fin. Thus, as described above, it is possible to provide a difference between the width of the fin FA formed in the region 1A and the width of the fin FB and the fin FC formed in the region 1B and the region 1C, by providing a difference between the width of the hard mask HM1 of the region 1A and the width of the hard mask HM1 of the region 1B and the region 1C.

After this, the resist pattern PR1 is removed by performing an ashing process.

Figure 11:
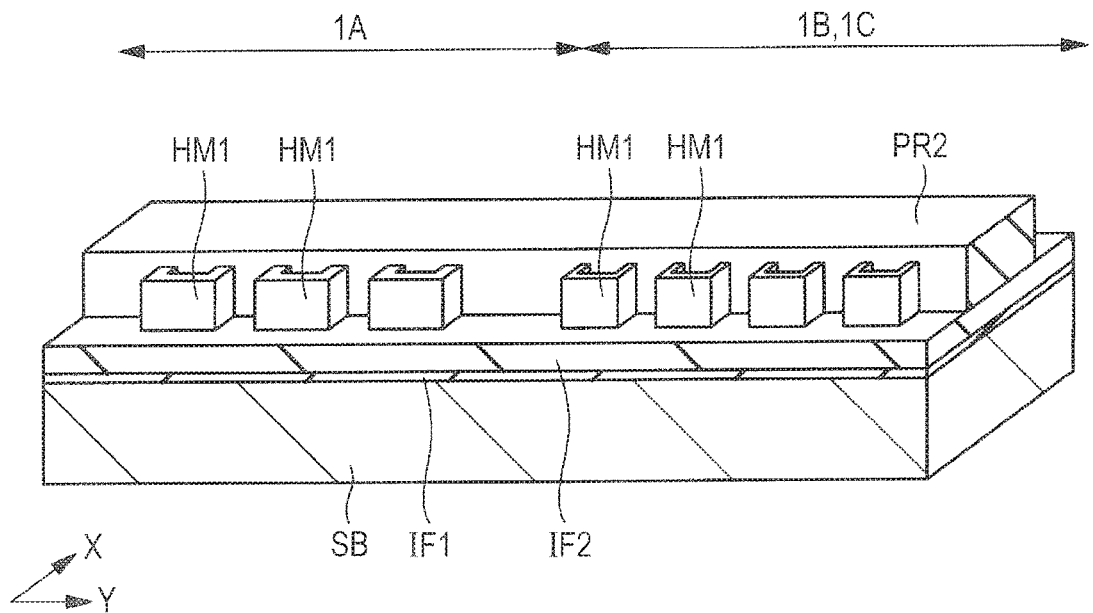
FIG. 11 is a perspective view for explaining a manufacturing process for the semiconductor device, after that of FIG. 9.

As illustrated in FIG. 11, a resist pattern PR2 covering a part of the hard mask HM1 is formed in each of the region 1A to the region 1C. The resist pattern PR2 is a pattern covering, of the hard mask HM1, apart extending in the direction "X", and for exposing the end part of the corresponding part extending in the direction "X" and the part extending in the direction "Y". That is, both end parts of the hard mask HM1 in the direction "X" are exposed from the resist pattern PR2.

Figure 12:
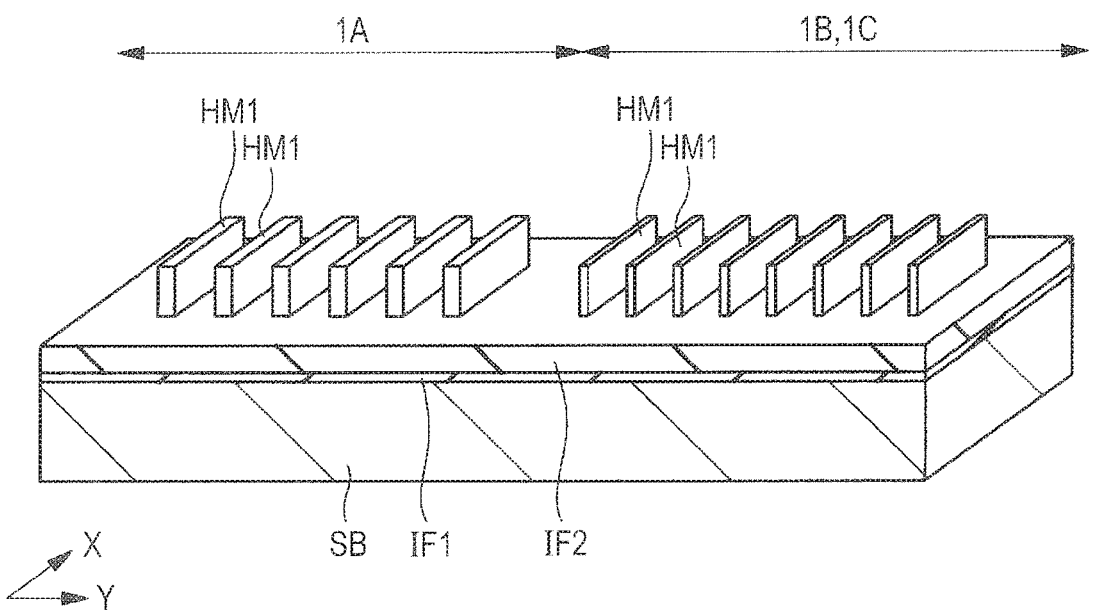
FIG. 12 is a perspective view for explaining a manufacturing process for the semiconductor device, after that of FIG. 11.
Figure 13:
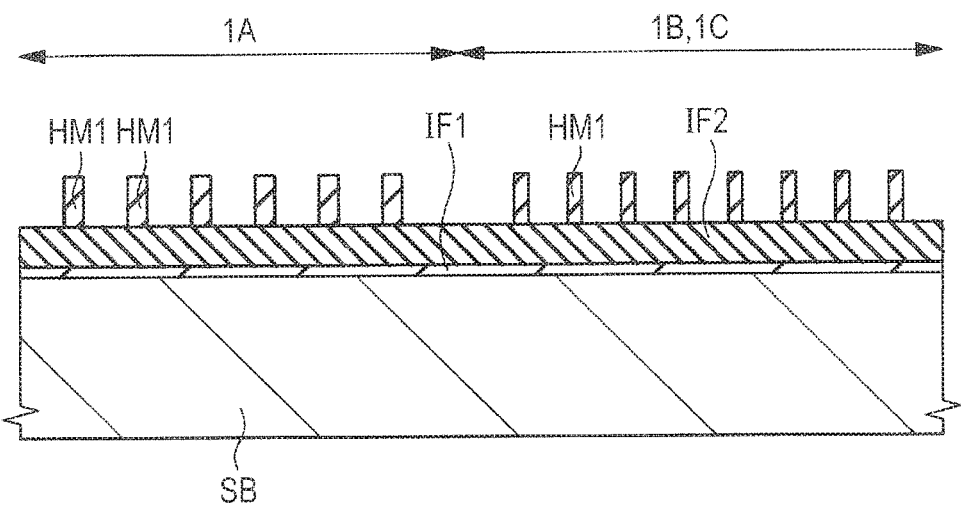
FIG. 13 is a cross sectional view along the direction "Y" of the semiconductor device in the manufacturing process illustrated in FIG. 12.

As illustrated in FIG. 12 and FIG. 13, the resist pattern PR2 is used as a mask, for performing the etching, thereby removing a part of each hard mask HM1. As a result of this, only a part of the hard mask HM1 extending in the direction X remains. That is, on the insulating film IF2, a plurality of hard masks HM1 as patterns extending in the direction "X" are arranged in the direction "Y".

After this, the resist pattern PR2 is removed using an ashing process.

Figure 14:
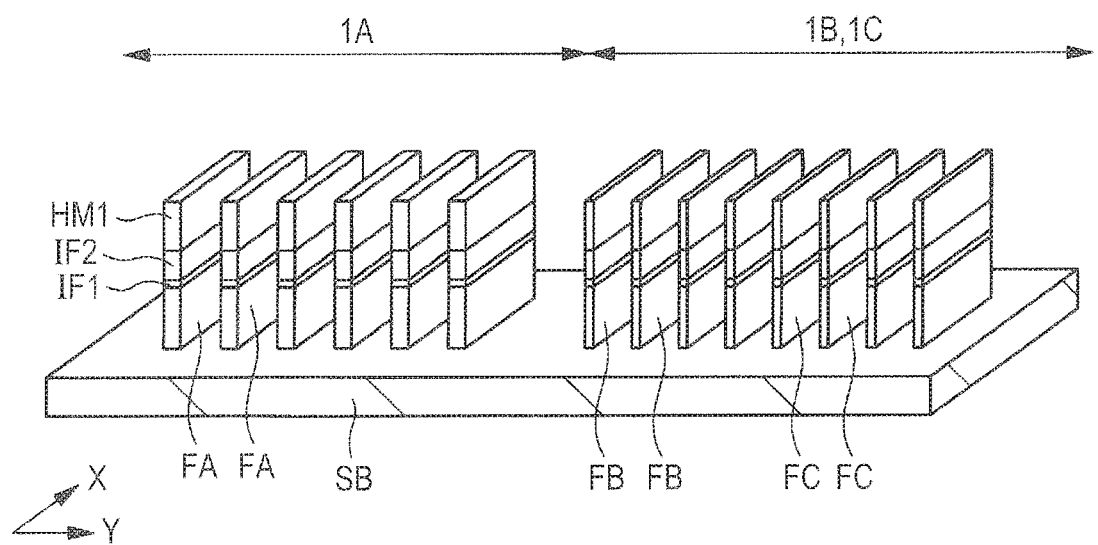
FIG. 14 is a perspective view for explaining a manufacturing process for the semiconductor device, after that of FIG. 12.
Figure 15:
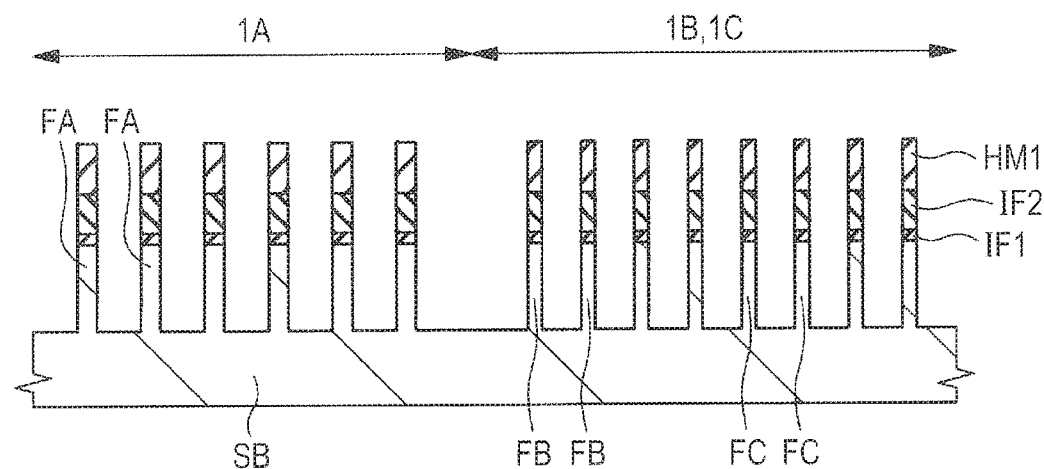
FIG. 15 is a cross sectional view along the direction "Y" of the semiconductor device in the manufacturing process illustrated in FIG. 14.

As illustrated in FIG. 14 and FIG. 15, anisotropic dry etching is performed for the insulating film IF2, the insulating film IF1, and the semiconductor substrate SB, with using the hard mask HM1 as a mask. As a result, there is formed a pattern (the fin FA, the fin FB, and the fin FC) as a part of the semiconductor substrate SB which is processed in a plate-like form (wall-like form), right under the hard mask HM1. In this case, the main surface of the semiconductor substrate SB of the region exposed from the hard mask HM1 is dug from 100 to 250 nm, thereby forming the fin FA, the fin FB, and the fin FC having a height of 100 to 250 nm from the main surface of the semiconductor substrate SB.

Figure 16:
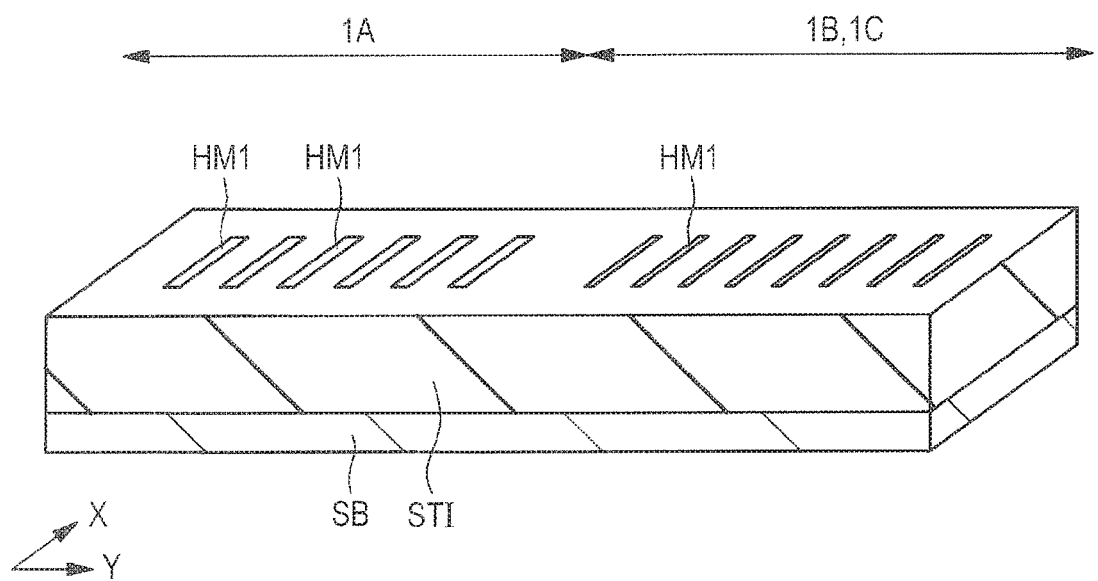
FIG. 16 is a perspective view for explaining a manufacturing process for the semiconductor device, after that of FIG. 14.
Figure 17:
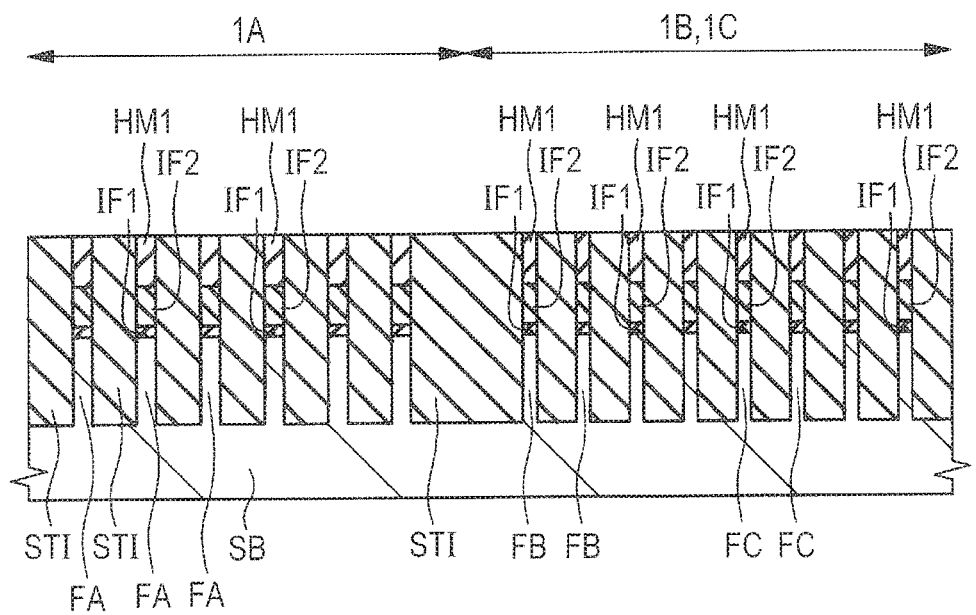
FIG. 17 is a cross sectional view along the direction "Y" of the semiconductor device in the manufacturing process illustrated in FIG. 16.

As illustrated in FIG. 16 and FIG. 17, an insulating film formed from a silicon oxide film is deposited on the semiconductor substrate SB, in a manner to fill between the fin FA, the fin FB, the fin FC, the insulating film IF1, the insulating film IF2, and the hard mask HM1. Subsequently, a polishing process is performed for this insulating film using a CMP (Chemical Mechanical Polishing) technique, for exposing the upper surface of the hard mask HM1. This results in forming the element isolation part STI formed from the above insulating film.

Figure 18:
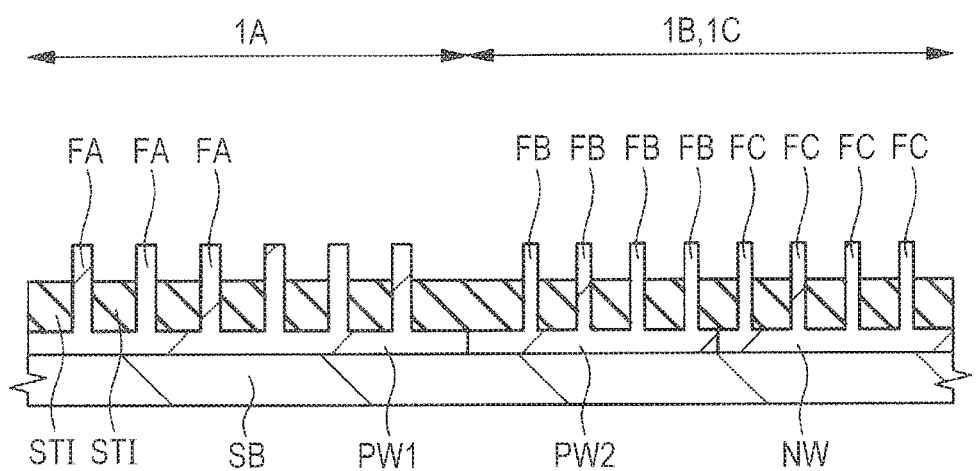
FIG. 18 is a cross sectional view for explaining a manufacturing process for the semiconductor device, after that of FIG. 17.

Now, as illustrated in FIG. 18, the hard mask HM1, the insulating film IF1, and the insulating film IF2 are removed. Subsequently, an etching process is performed for the upper surface of the element isolation part STI, thereby retreating the upper surface of the element isolation part STI in a height direction. As a result, a part and the upper surface and the side surface of the fin FA, the fin FB, and the fin FC are exposed.

After this, using a photolithography technique and an ion implantation technique, impurities are introduced to the main surface of the semiconductor substrate SB, thereby forming the p-type well PW1 in the fin FA of the region 1A, forming the p-type well PW2 in the fin FB of the region 1B, and forming the n-type well NW in the fin FC of the region 1C. The impurities for forming the p-type well PW1 and the p-type well PW2 are, for example, boron (B) or boron difluoride ($BF_2$). The impurities for forming the n-type well NW are, for example, phosphorus (P) or Arsenic (As). Each of the wells spreads out and is formed entirely in each fin and in a part of the semiconductor substrate SB in the lower part of each fin.

As described above, the fin FA is formed in the region 1A, the fin FB is formed in the region 1B, and the fin FC is formed in the region 1C.

Descriptions will now be made to the following manufacturing processes, using FIG. 19 to FIG. 47. The region 1A, the region 1B, and the region 1C illustrated in FIG. 19 to FIG. 47 correspond to those explained in FIG. 4, and are illustrated in cross sectional views, taken along lines A-A of FIG. 2, B-B of FIG. 2, and C-C of FIG. 2.

Figure 19:
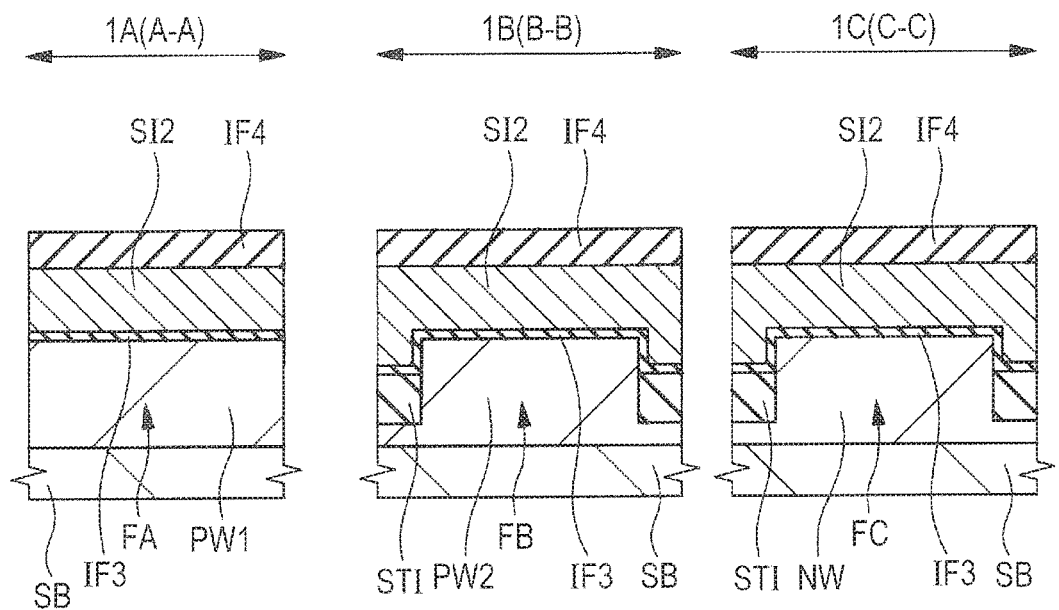
FIG. 19 is a cross sectional view for explaining a manufacturing process for the semiconductor device, after that of FIG. 17.

FIG. 19 illustrates a formation process for an insulating film IF3, a conductive film SI2, and an insulating film IF4. First, there is formed the insulating film IF3 covering the fin FA, the fin FB, and the fin FC. The insulating film IF3 is a silicon oxide film which has been formed using, for example, a thermal oxidation technique, and has a thickness of approximately 2 nm. Subsequently, using, for example, the CVD technique, a conductive film SI2 is deposited on the insulating film IF3. After this, using, for example, the CMP technique, the upper surface of the conductive film SI2 is planarized, thereby forming the conductive film SI2 having the planar upper surface. Then, on the conductive film SI2, using, for example, the CVD technique, the insulating film IF4 is formed. The conductive film SI2 is formed from, for example, a polycrystalline silicon film, and the insulating film IF4 is formed from, for example, a silicon nitride film. As described above, even after a polishing process is performed for the conductive film using the CMP technique, the conductive film SI2 still remains on the upper surface of the fin FA and the upper surface of the fin FB.

Figure 20:
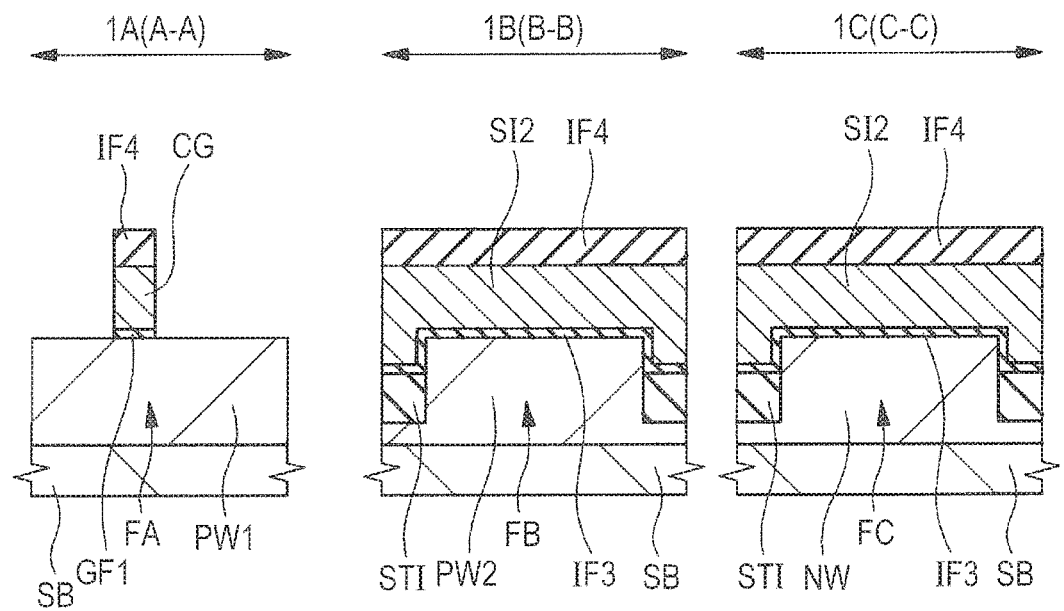
FIG. 20 is a cross sectional view for explaining a manufacturing process for the semiconductor device, after that of FIG. 19.

FIG. 20 illustrates a formation process for the control gate electrode CG. The insulating film IF4 of the region 1A is selectively patterned using a photolithography and a dry etching technique. At this time, the insulating film IF4 of the region 1B and the region 1C is not patterned. Subsequently, dry etching is performed for the conductive film SI2, thereby forming the control gate electrode CG in the region 1A, with using the patterned insulating film IF4 as a mask. After this, the insulating film IF3 exposed from the control gate electrode CG is removed, thereby forming the gate insulating film GF1 below the control gate electrode CG.

Figure 21:
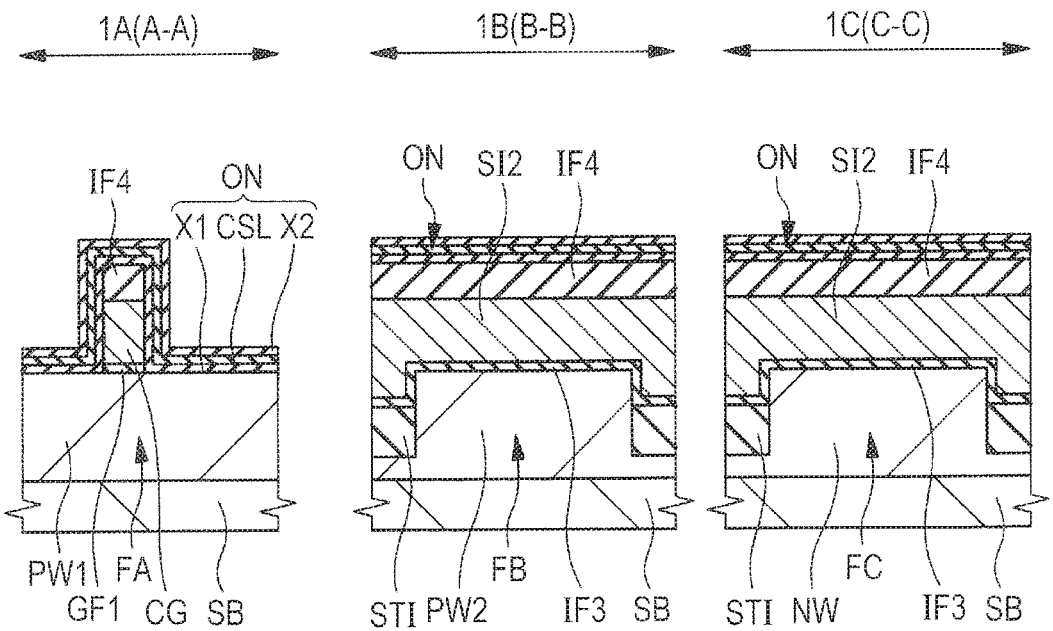
FIG. 21 is a cross sectional view for explaining a manufacturing process for the semiconductor device, after that of FIG. 20.

FIG. 21 illustrates a formation process for the insulating film ON. The insulating film ON is formed from a laminated film of the insulating film X1, the charge storage layer CSL, and the insulating film X2. Using, for example, a thermal oxidation technique, the insulating film X1 is formed on the upper surface and the side surface of the fin FA exposed from the control gate electrode CG. The insulating film X1 is, for example, a silicon oxide film, and has a thickness of 4 nm. Using, for example, the CVD technique, the charge storage layer CSL is formed on the insulating film X1. The charge storage layer CSL is a trap insulating film which can hold charges, and is, for example, a silicon nitride film having a thickness of 7 nm. Using, for example, the CVD technique, the insulating film X2 is formed on the charge storage layer CSL. The insulating film X2 is, for example, a silicon oxide film or a silicon oxynitride film, and has a thickness of 9 nm. The charge storage layer CSL may be formed from a film including a metal oxide film which is formed by nitriding hafnium or aluminum, instead of a silicon nitride film.

As shown in the region 1A, in the long-side direction (direction "X") of the fin FA, the insulating film ON is formed on the upper surface of the fin FA, on the side surface of the control gate electrode CG, and on the side surface of the insulating film IF4. That is, the insulating film ON is formed in an L-like shape, in the long-side direction (direction "X") of the fin FA.

Figure 22:
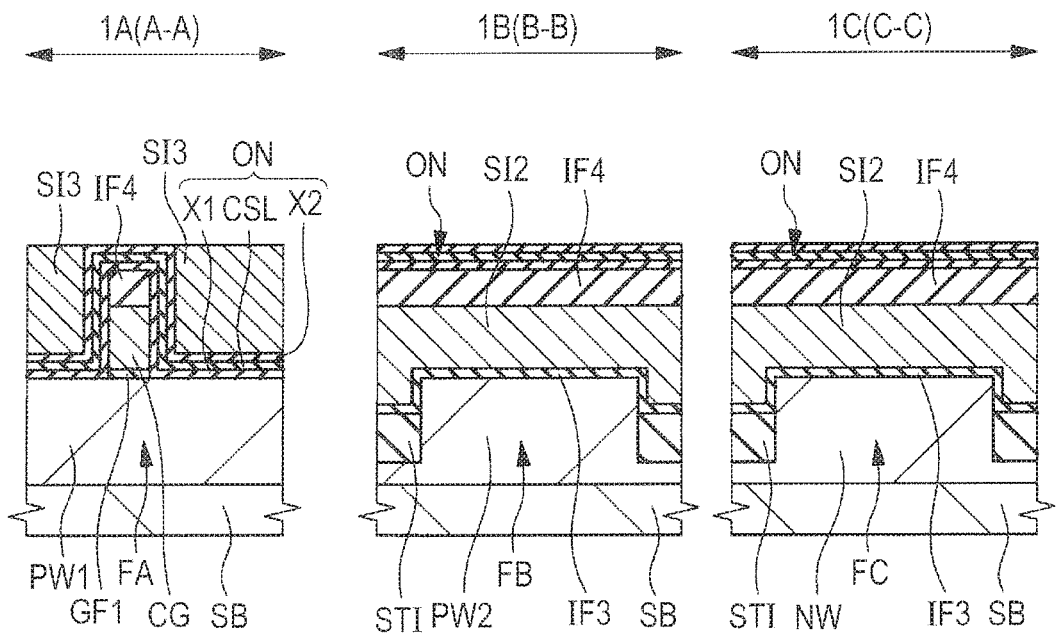
FIG. 22 is a cross sectional view for explaining a manufacturing process for the semiconductor device, after that of FIG. 21.

FIG. 22 illustrates a formation process for the conductive film S13. Using, for example, the CVD technique, the conductive film S13 is deposited on the insulating film ON. The conductive film S13 is formed from, for example, a polycrystalline silicon film. After this, the CMP process is performed for this conductive film S13, thereby exposing the insulating film ON on the control gate electrode CG. That is, the conductive film S13 is polished, with using the insulating film ON as a stopper. As a result, as shown in the region 1A, the conductive film S13 is selectively formed in a region adjacent to the control gate electrode CG. Note that, in the region IB and the region 1C, the conductive film S13 is removed, thus resulting in exposing the insulating film ON.

Figure 23:
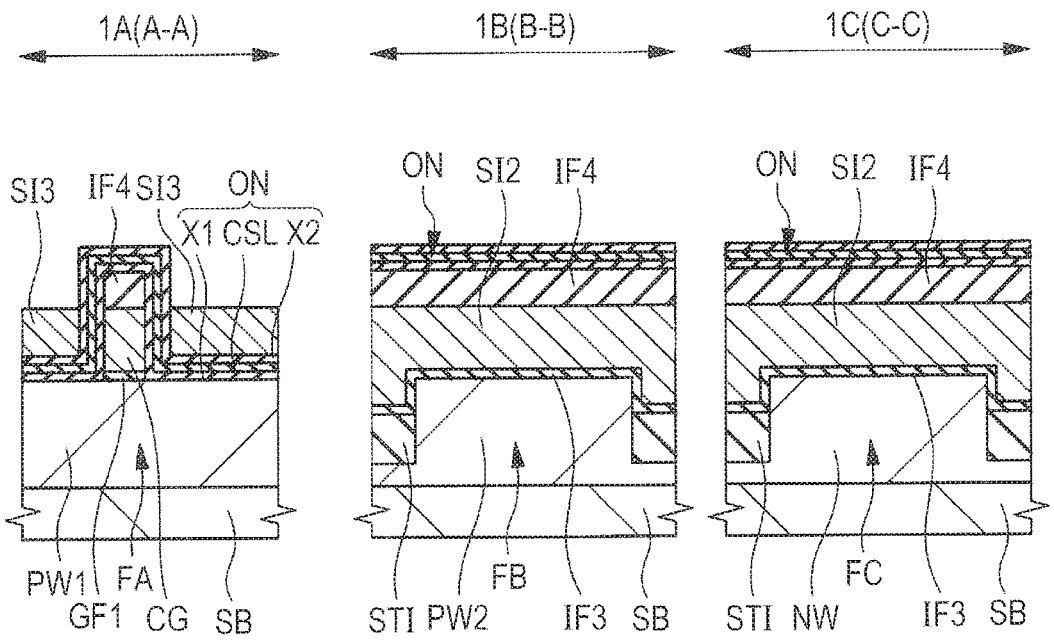
FIG. 23 is a cross sectional view for explaining a manufacturing process for the semiconductor device, after that of FIG. 22.

FIG. 23 illustrates a process for retreating the upper surface of the conductive film S13. As shown in the region 1A, the dry etching process or the wet etching process is performed for the conductive film S13, thereby lowering the height of the upper surface of the conductive film S13. The insulating film ON functions as an etching stopper. Thus, the mask, such as the resist pattern, is not necessary. After this etching process, the height of the upper surface of the conductive film S13 is approximately equal to the height of the upper surface of the control gate electrode CG.

Figure 24:
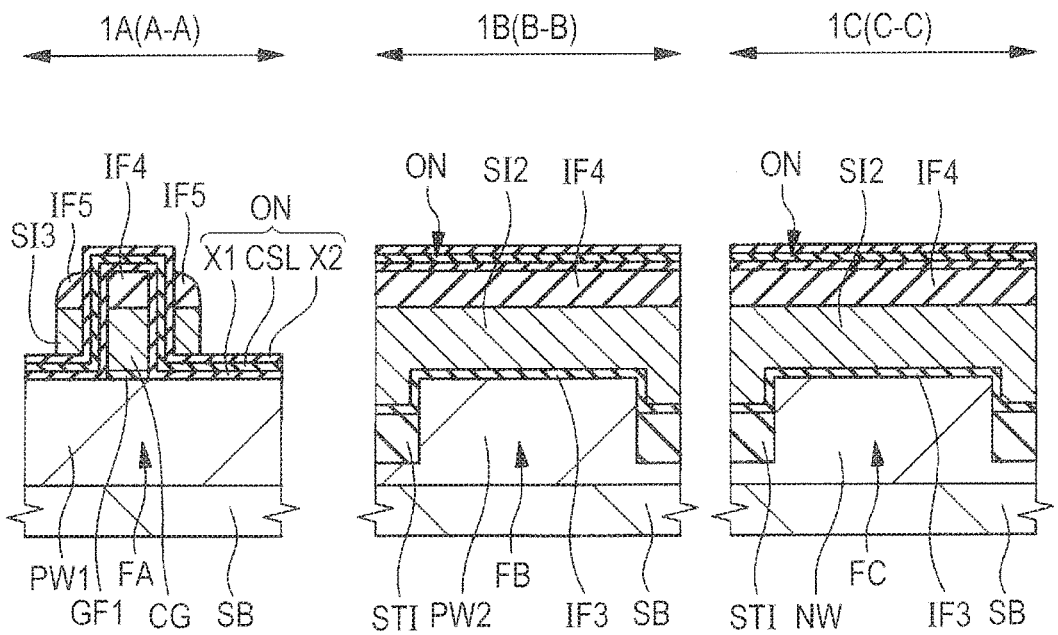
FIG. 24 is a cross sectional view for explaining a manufacturing process for the semiconductor device, after that of FIG. 23.

FIG. 24 illustrates a formation process for an insulating film IF5 and the memory gate electrode MG. First, there is formed the insulating film IF5 which is formed from, for example, a silicon nitride film on the conductive film S13 retreated in FIG. 23, using the CVD technique. After this, by performing anisotropic dry etching, the insulating film IF5 is processed in a sidewall spacer form in a manner that the insulating film IF5 remains on the conductive film S13 formed in the region 1A. At this time, the insulating film IF5 of the region 1B and the region 1C is removed. By performing anisotropic dry etching with using this insulating film IF5 as a mask, the conductive film S13 exposed from the insulating film IF5 is removed. As a result, the memory gate electrode MG is formed on both side surfaces of the control gate electrode CG through the insulating film ON.

Figure 25:
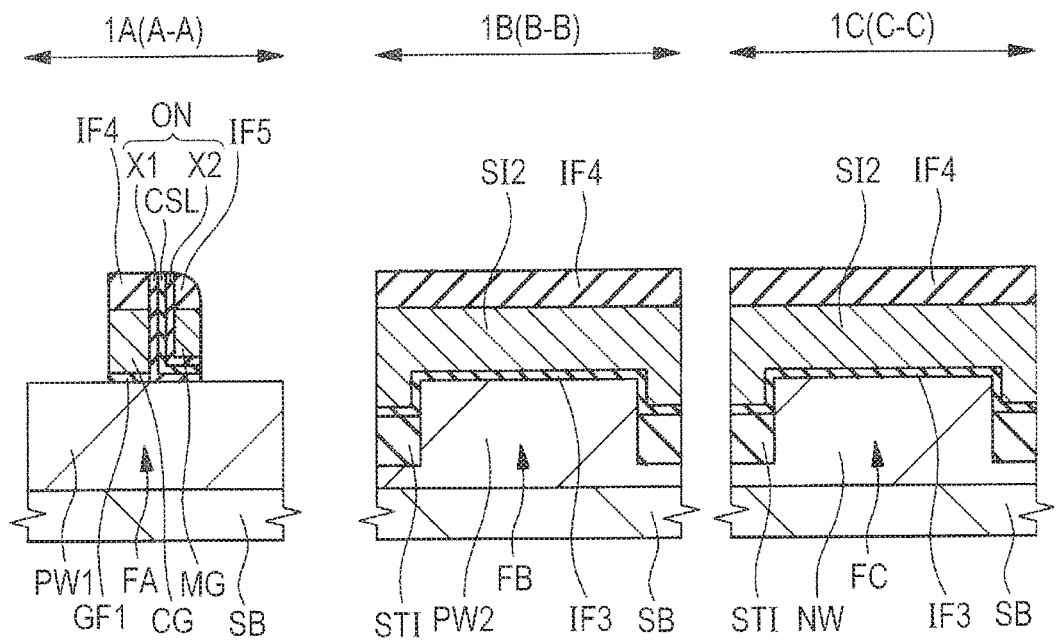
FIG. 25 is a cross sectional view for explaining a manufacturing process for the semiconductor device, after that of FIG. 24.

FIG. 25 illustrates a process for removing one of the memory gate electrodes MG formed on both side surfaces of the control gate electrodes CG. First, there is formed a resist pattern (not illustrated) which covers the memory gate electrode MG formed on one side surface of the control gate electrode CG. Next, dry etching and wet etching are performed with using this resist pattern as a mask, thereby removing the insulating film IF5 and the memory gate electrode MG which are not covered by the resist pattern. As a result, the memory gate electrode MG remains only on the side of the source region of the memory cell MC. The insulating film ON in a region exposed from the memory gate electrode MG is removed by the dry etching and the wet etching. As shown in the region 1A, the insulating film ON selectively remains between the memory gate electrode MG and the fin FA and also between the memory gate electrode MG and the control gate electrode CG. The insulating film ON formed in the region 1B and the region 1C is removed by this process.

Figure 26:
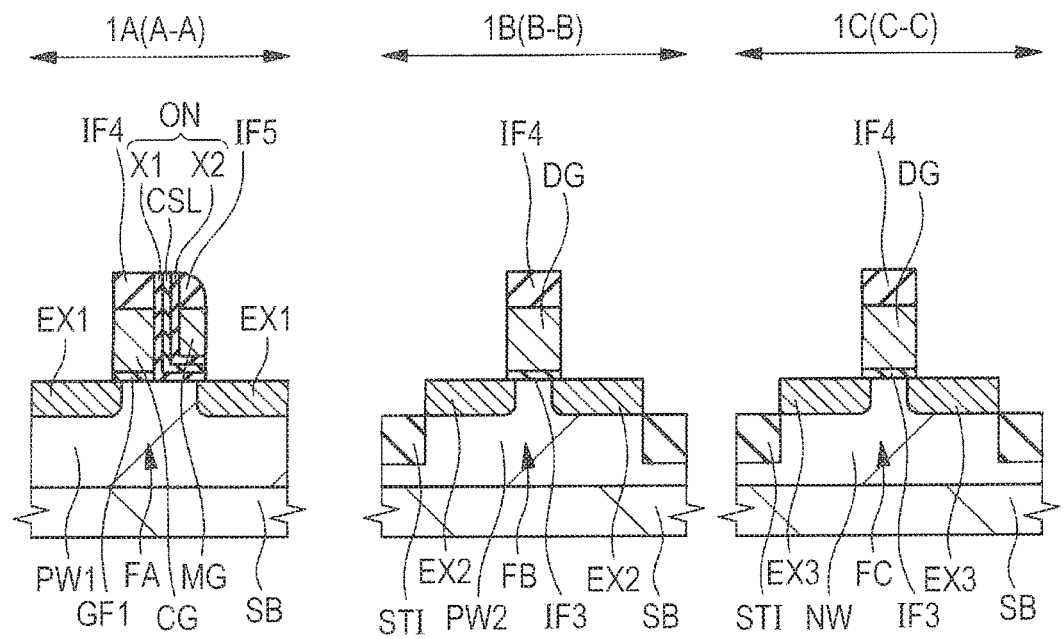
FIG. 26 is a cross sectional view for explaining a manufacturing process for the semiconductor device, after that of FIG. 25.

FIG. 26 illustrates a formation process for a dummy gate electrode DG and the extension regions EX1 to EX3. In the region 1B and the region 1C, the insulating film IF4 and the conductive film SI2 are patterned using a photolithography technique and a dry etching technique, thereby forming the gate electrode DG. After this, the insulating film IF3 exposed from the dummy gate electrode DG is removed.

For example, arsenic (As) or phosphorus (P) is introduced into the fin FA and the fin FB using the ion implantation technique, thereby forming the n⁻-type extension region EX1 (semiconductor region EX1) in the fin FA and forming the n⁻-type extension region EX2 (semiconductor region EX2) in the fin FB. Boron (B) or boron difluoride ($BF_2$) is introduced into the fin FC using the ion implantation technique, thereby forming the p⁻-type extension region EX3 (semiconductor region EX3).

The extension region EX1 of the region 1A is formed by self-matching with the control gate electrode CG and the memory gate electrode MG. That is, n-type impurities are implanted to the upper surface and the side surface of the fin FA exposed from the control gate electrode CG and the memory gate electrode MG. Thus, the extension region EX1 is formed on both sides of the control gate electrode CG and the memory gate electrode MG in a manner that the control gate electrode CG and the memory gate electrode MG are sandwiched therein. Because impurities are diffused by the thermal process after ion implantation, the extension region EX1 partially overlaps in plan view with the control gate electrode CG and the memory gate electrode MG.

The extension region EX2 of the region 1B is formed by self-matching with the dummy gate electrode DG. That is, the n-type impurities are implanted to the upper surface and the side surface of the fin FB exposed from the dummy gate electrode DG. Thus, the extension region EX2 is formed on both sides of the dummy gate electrode DG in a manner that the dummy gate electrode DG is sandwiched therebetween. Because the impurities are diffused by the thermal process after ion implantation, the extension region EX2 partially overlaps in plan view with the dummy gate electrode DG.

The extension region EX3 of the region 1C is formed by self-matching with the dummy gate electrode DG. That is, the n-type impurities are implanted to the upper surface and the side surface of the fin FC exposed from the dummy gate electrode DG. Thus, the extension region EX3 is formed on both sides of the dummy gate electrode DG in a manner that the dummy gate electrode DG is sandwiched therebetween. Because the impurities are diffused by the thermal process after ion implantation, the extension region EX3 partially overlaps in plan view with the dummy gate electrode DG.

Figure 27:
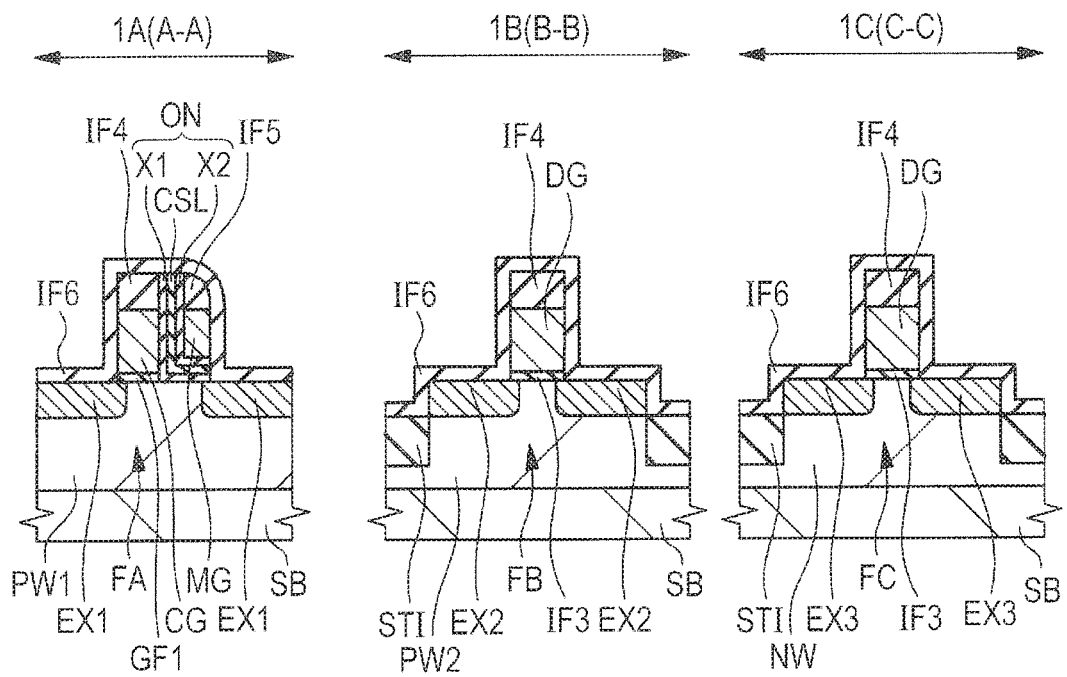
FIG. 27 is a cross sectional view for explaining a manufacturing process for the semiconductor device, after that of FIG. 26.

FIG. 27 illustrates a formation process for an insulating film IF6. The insulating film which is formed from, for example, silicon nitride is formed on the semiconductor substrate SB, using the CVD technique, in a manner to cover the memory cell MC, the n-type transistor QN, and the p-type transistor QP.

Figure 28:
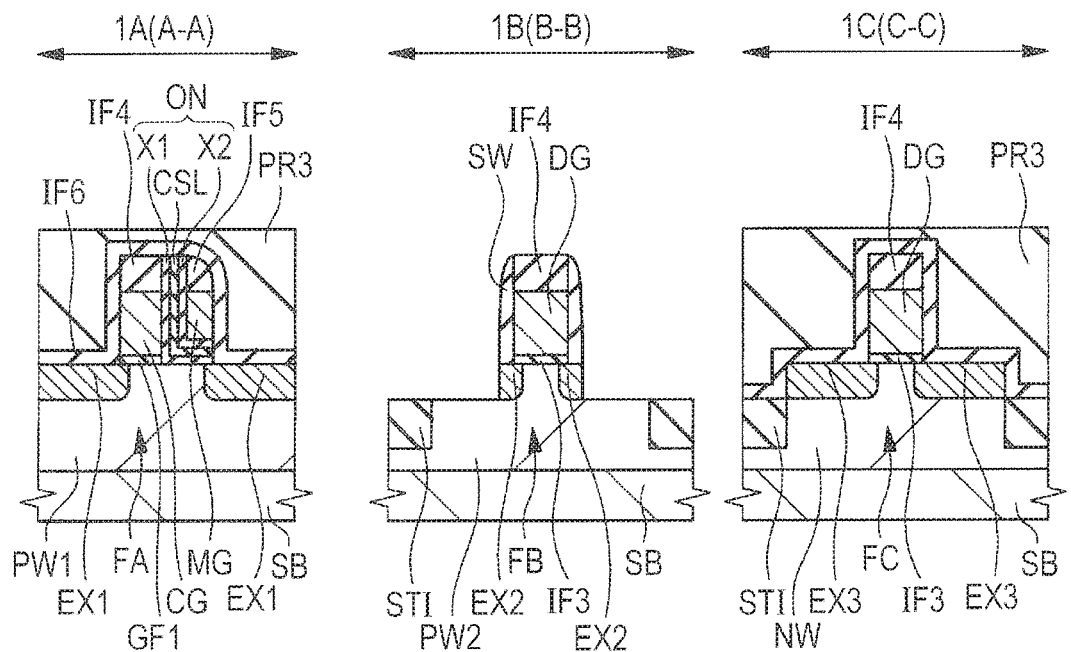
FIG. 28 is a cross sectional view for explaining a manufacturing process for the semiconductor device, after that of FIG. 27.

As illustrated in FIG. 28, there is formed a resist pattern PR3 for exposing the region 1B and covering the region 1A and the region 1C. Dry etching is performed with using the resist pattern PR3 as a mask, thereby partially removing the insulating film IF6 of the region 1B. This results in exposing the upper surface of each of the element isolation part STI, the fin FB, and the insulating film IF4. In the region 1B, a sidewall spacer SW formed from the insulating film IF6 is formed on the side surface of the dummy gate electrode DG and the side surface of the insulating film IF4.

Dry etching is performed with using the resist pattern PR3, the insulating film IF4, and the sidewall spacer SW as masks, thereby retreating the upper surface of the fin FB exposed from the dummy gate electrode DG of the region 1B and from the sidewall spacer SW. As a result, the retreated upper surface of the fin FB is in a position higher than the upper surface of the element isolation part STI and in a position lower than the upper surface of the fin FB right below the dummy gate electrode DG.

After this, the resist pattern PR3 is removed using an asking process.

Figure 29:
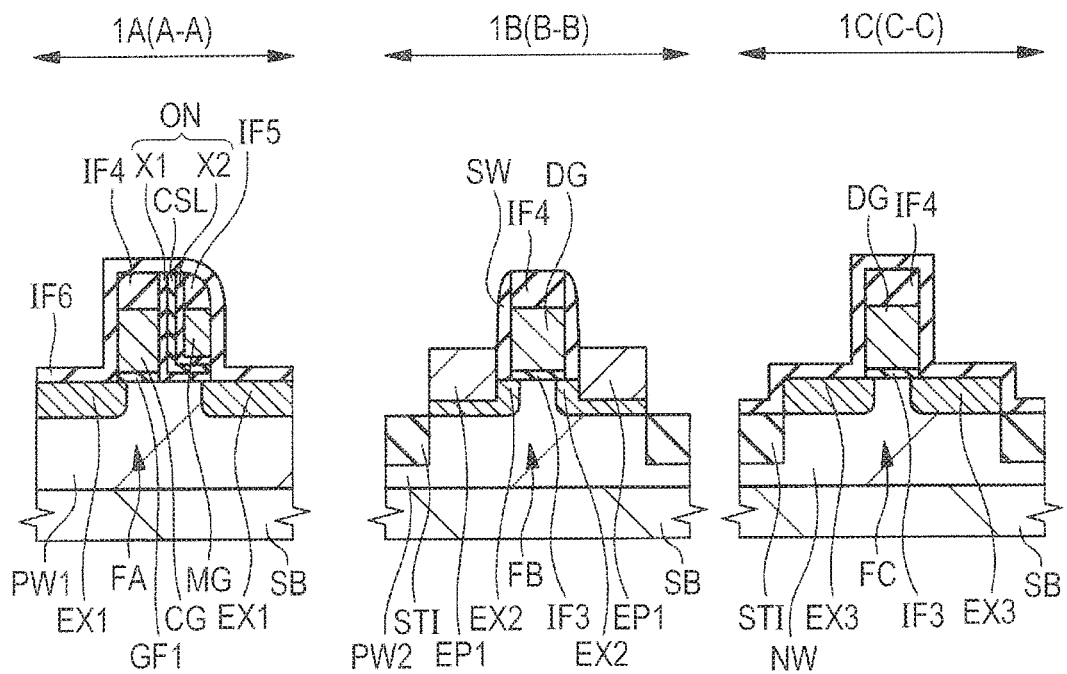
FIG. 29 is a cross sectional view for explaining a manufacturing process for the semiconductor device, after that of FIG. 28.

FIG. 29 illustrates a formation process for the epitaxial layer EP1. There is formed the epitaxial layer EP1 on the upper surface and the side surface of the fin FB exposed from the dummy gate electrode DG of the region 1B and from the sidewall spacer SW, using an epitaxial growth process. The epitaxial layer EP1 mainly includes, for example, Si (silicon). In this example, it is formed from, for example, SiP (silicon phosphorus) or SiC (silicon carbide). At this time, the region 1A and the region 1C are covered by the insulating film IF6. Thus, the epitaxial layer EP1 is not formed.

As described in FIG. 3, the epitaxial layer EP1 has a rhomboid shape in cross section, and covers the side surface of the fin FB in the direction "Y". In FIG. 29, though the epitaxial layer EP1 does not cover the side surface of the fin FB in the direction "X", but it may in fact cover the side surface.

Figure 30:
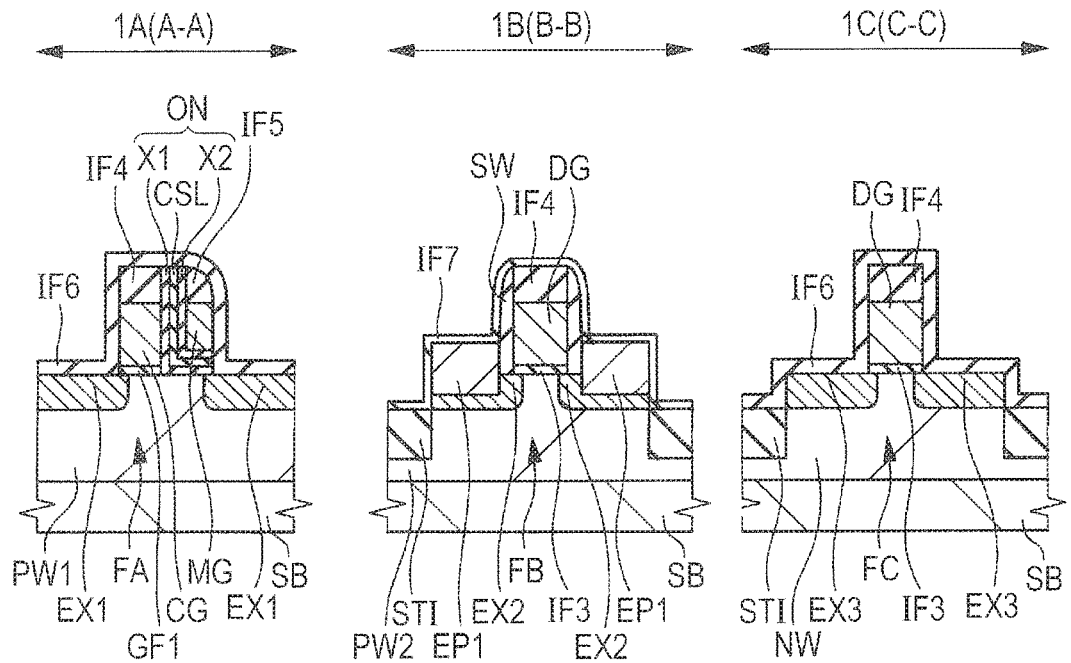
FIG. 30 is a cross sectional view for explaining a manufacturing process for the semiconductor device, after that of FIG. 29.

FIG. 30 illustrates a formation process for an insulating film IF7. There is formed the insulating film IF7 formed from, for example, a silicon nitride film on the semiconductor substrate SB, using, for example, the CVD technique. In the region 1A and the region 1C, the insulating film IF7 is formed to cover the surface of the insulating film IF6. However, in the illustration, the insulating film IF7 is incorporated with the insulating film IF6, and is not illustrated in the region 1A and the region 1C.

Figure 31:
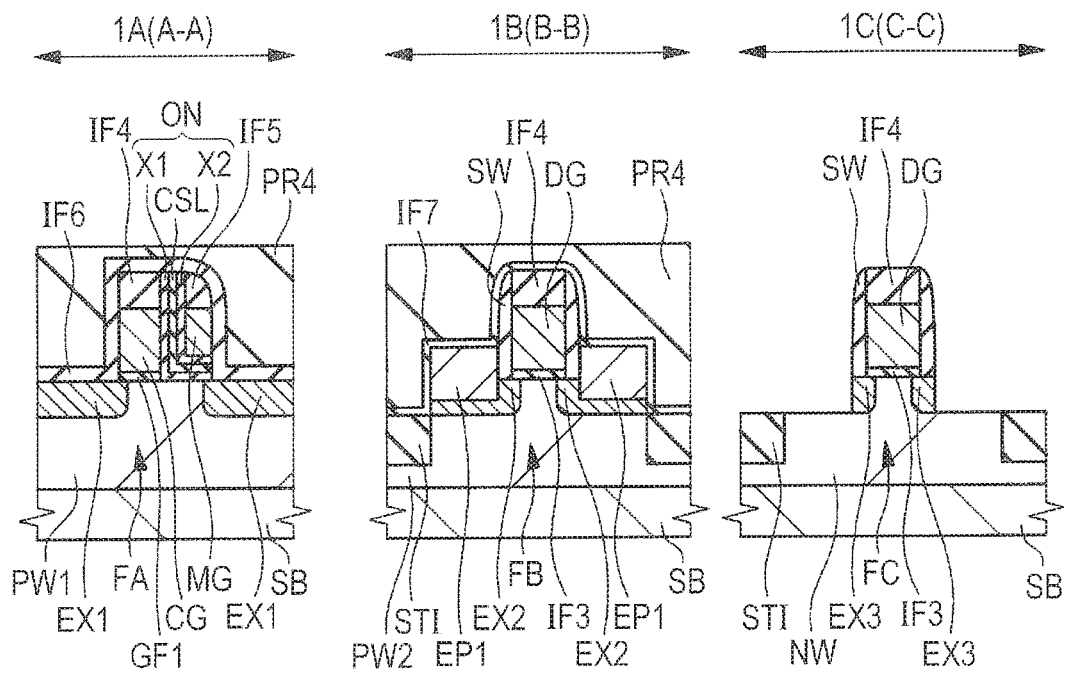
FIG. 31 is a cross sectional view for explaining a manufacturing process for the semiconductor device, after that that of FIG. 30.

As illustrated in FIG. 31, there is formed the resist pattern PR4 for exposing the region 1C and covering the region 1A and the region 1B. Subsequently, dry etching is performed with using the resist pattern PR4 as a mask, thereby partially removing the insulating film IF7 of the region 1C. This results in exposing the upper surface of each of the element isolation part STI, the fin FC, and the insulating film IF4. In the region 1C, the sidewall spacer SW formed from the insulating film IF7 is formed on the side surface of the dummy gate electrode DG and the side surface of the insulating film IF4.

Dry etching is performed with using the resist pattern PR4, the insulating film IF4, and the sidewall spacer SW as masks, thereby retreating the upper surface of the fin FC exposed from the dummy gate electrode DG in the region 1C and from the sidewall spacer SW. As a result, the retreated upper surface of the fin FC is in a position higher than the upper surface of the element isolation part STI and in a position lower than the upper surface of the fin FC right below the dummy gate electrode DG.

After this, the resist pattern PR4 is removed using the asking process.

Figure 32:
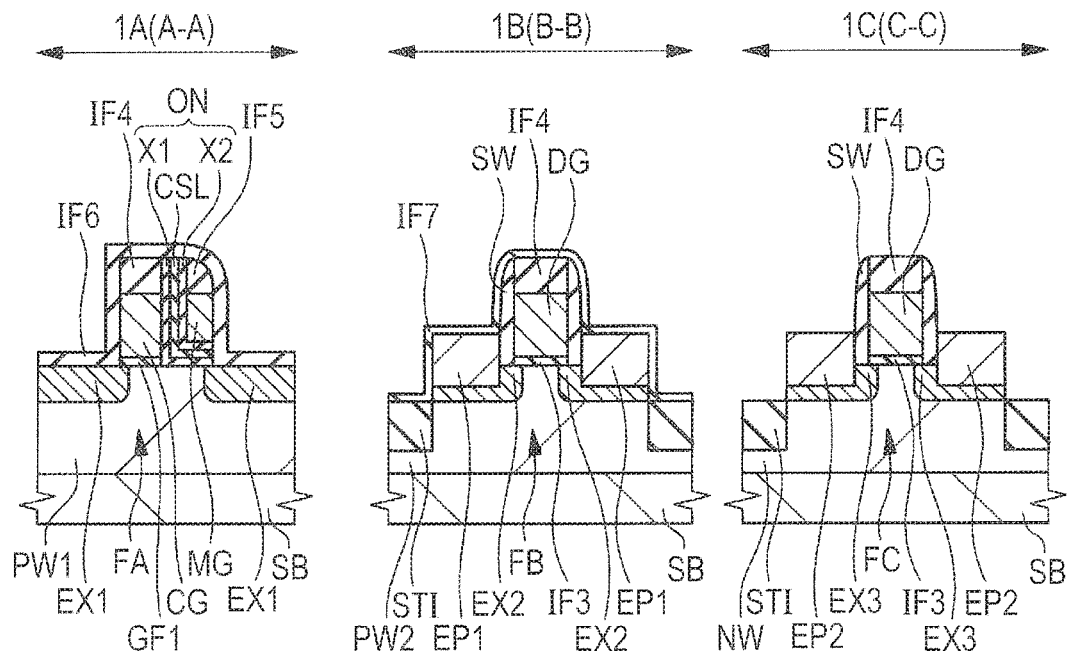
FIG. 32 is a cross sectional view for explaining a manufacturing process for the semiconductor device, after that of FIG. 31.

FIG. 32 illustrates a formation process for the epitaxial layer EP2. There is formed the epitaxial layer EP2 on the upper surface and the side surface of the fin FC exposed from the dummy gate electrode DG of the region 1C and from the sidewall spacer SW. The epitaxial layer EP2 mainly includes, for example, Si (silicon), and is formed from, for example, SiGe (silicon germanium). At this time, the region 1A and the region 1B are covered by the insulating film IF6 or the insulating film IF7. Thus, the epitaxial layer EP2 is not formed.

As described in FIG. 3, the epitaxial layer EP2 is a semiconductor layer having a rhomboid shape in cross section, and covers the side surface of the fin FC in the direction "Y". In FIG. 32, the epitaxial layer EP2 does not cover the side surface of the fin FC in the direction "X", but it may in fact cover the surface.

Figure 33:
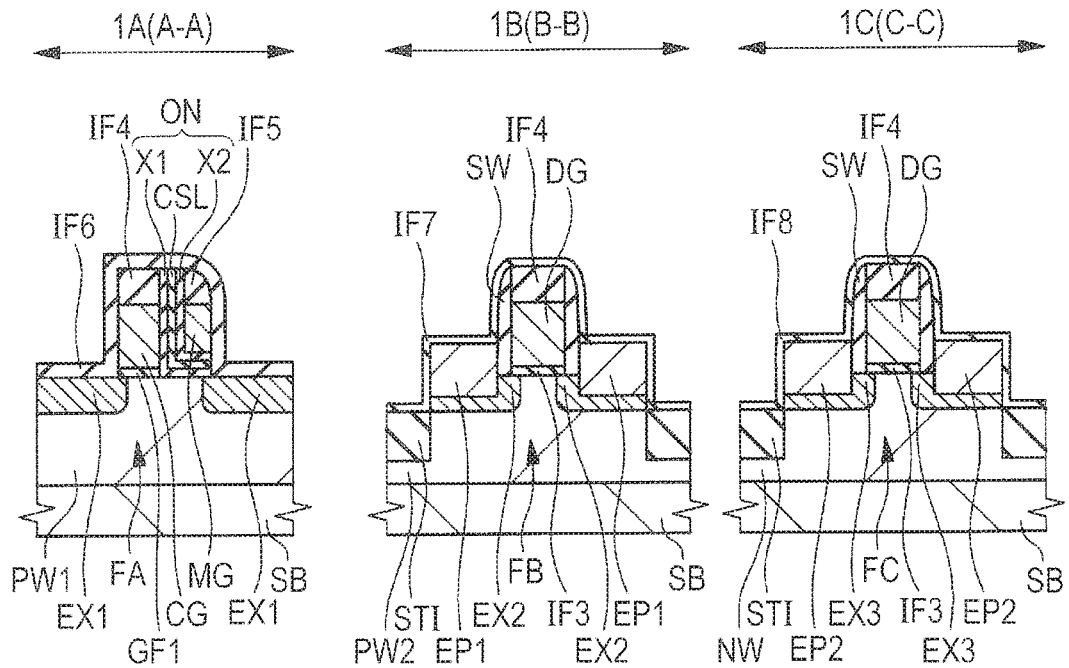
FIG. 33 is a cross sectional view for explaining a manufacturing process for the semiconductor device, after that of FIG. 32.

FIG. 33 illustrates a formation process for an insulating film IF8. There is formed the insulating film IF8 formed from, for example, a silicon nitride film on the semiconductor substrate SB, using, for example, the CVD technique. In the region 1A, the insulating film IF8 is formed to cover the surface of the insulating film IF6. However, in the illustration, the insulating film IF8 is incorporated with the insulating film IF6, and is not illustrated in the region 1A. In the region 1B, the insulating film IF8 is formed to cover the surface of the insulating film IF7. In the illustration, the insulating film IF8 is incorporated with the insulating film IF7, and is not illustrated in the region 1B.

Figure 34:
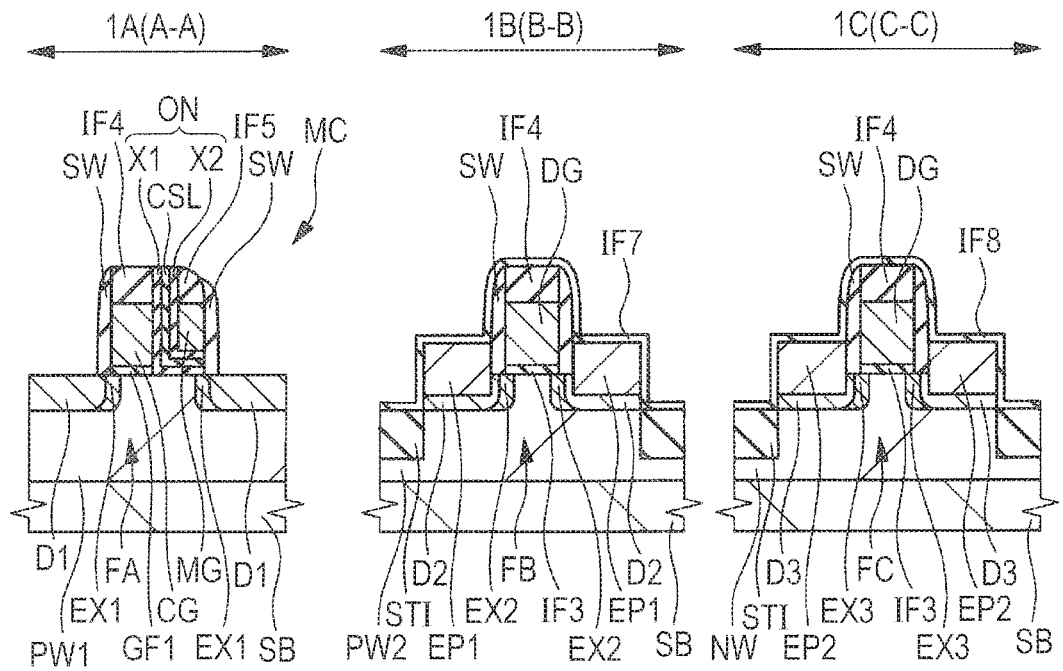
FIG. 34 is a cross sectional view for explaining a manufacturing process for the semiconductor device, after that of FIG. 33.

FIG. 34 illustrates a formation process for the sidewall spacer SW, an $n^+$-type diffusion region D1 (semiconductor region D1), an $n^+$-type diffusion region D2 (semiconductor region D2), and a $p^+$-type diffusion region D3 (semiconductor region D3). Using the photolithography technique and the anisotropic dry etching, the insulating film IF6 of the region 1A is partially and selectively removed. This results in exposing the upper surface of each of the element isolation part STI, the fin FA, the insulating film IF4, and the insulating film IF5. In the region 1A, the sidewall spacer SW is formed on the side surface of each of the control gate electrode CG, the memory gate electrode MG, the insulating film IF4, and the insulating film IF5.

In the region 1A and the region 1B, using the photolithography technique and the ion implantation technique, for example, arsenic (As) or phosphorus (P) is introduced into the fin FA and the fin FB beside the sidewall spacer SW, thereby forming the $n^+$-type diffusion region D1 and the $n^+$-type diffusion region D2. The diffusion region D1 has an impurity concentration greater than that of the extension region EX1, while the diffusion region D2 has an impurity concentration greater than that of the extension region EX2.

In this manner, in the memory cell MC, the diffusion region D1 which functions as a part of the drain region MD and the source region MS is formed. In the n-type transistor QN, the diffusion region D2 which functions as a part of the drain region LD1 and the source region LS1 is formed.

In the memory cell MC of the region 1A, the diffusion region D1 may not necessarily be formed. However, in this embodiment, the diffusion region D1 is formed in the region 1A, by way of example.

In the region 1A, carbon or nitrogen is introduced into the fin FA, using the ion implantation technique with the sidewall spacer as a mask. As a result, when the silicide layer S1 is formed on the fin FA in the following process, it is possible to suppress overgrowth of the silicide layer S1. That is, it is possible to suppress that the grows of the silicide layer S1 reaches a part (channel region of the memory cell MC) of the fin FA which is covered by the control gate electrode CG and the memory gate electrode MG, over the extension region EX1. Thus, it is preferred that carbon or nitrogen is introduced not only in the formation region of the silicide layer S1, but also the extension region EX1. According to a preferred ion implantation for forming a region into which carbon or nitrogen is introduced, the dose is $1*10^{15}/cm^2$, implantation energy is 5 keV, and it is performed at an angle vertical to the semiconductor substrate SB. Alternatively, it is performed at an angle inclined by 1 to 10° from a vertical line to the semiconductor substrate SB.

In the region 1C, for example, boron (B) or boron difluoride ($BF_2$) is introduced into the fin FC beside the sidewall spacer SW, using the photolithography technique and the ion implantation technique, thereby forming the $p^+$-type diffusion region D3. Note that the diffusion region D3 has an impurity concentration greater than that of the extension region EX3.

In this manner, in the p-type transistor QP, there is formed the diffusion region D3 which functions as a part of the drain region LD2 and the source region LS2.

Figure 35:
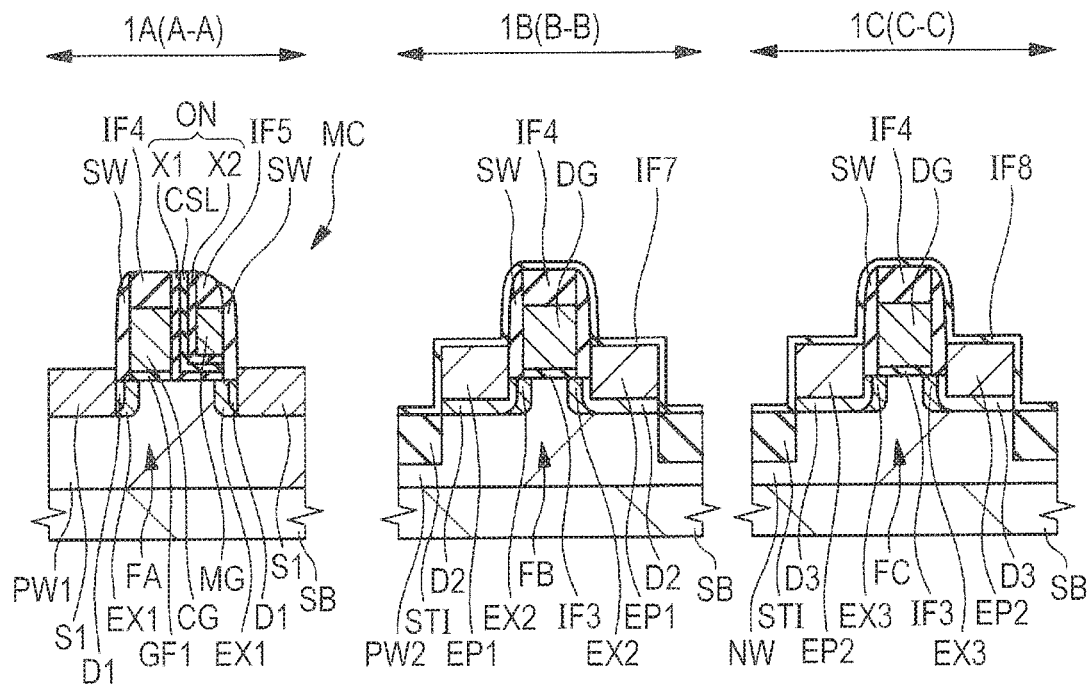
FIG. 35 is a cross sectional view for explaining a manufacturing process for the semiconductor device, after that of FIG. 34.

FIG. 35 illustrates a formation process for the silicide layer S1. As described above, the silicide layer S1 of the region 1A is formed as a full-silicide layer. The silicide layer S1 is formed from a film including nickel (Ni) and silicon (Si), for example, nickel silicide (Nisi).

Figure 45:
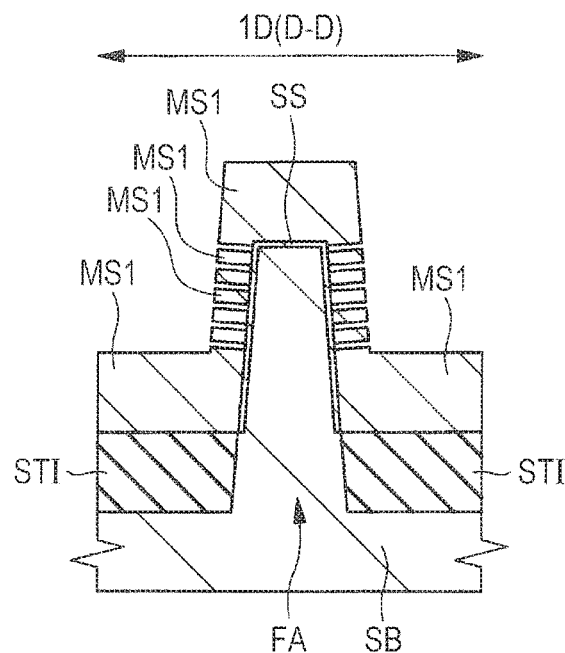
FIG. 45 is a cross sectional view for explaining details of a manufacturing process for the semiconductor device, after that of FIG. 35.
Figure 46:
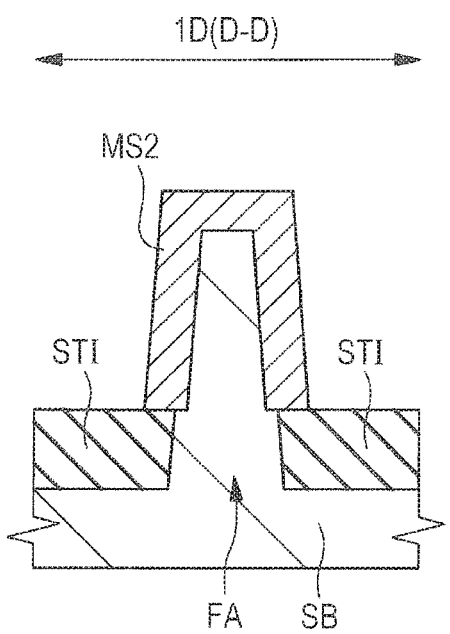
FIG. 46 is a cross sectional view for explaining a manufacturing process for the semiconductor device, after that of FIG. 45.
Figure 47:
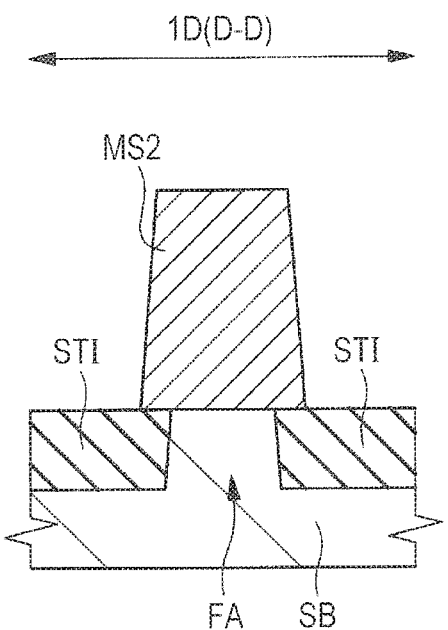
FIG. 47 is a cross sectional view for explaining a manufacturing process for the semiconductor device, after that of FIG. 46.

FIG. 45 to FIG. 47 are diagrams for specifically explaining a process for forming the silicide layer S1 as a full-silicide layer, and cross sectional views in the direction "Y" of the fin FA along a line D-D of FIG. 2.

FIG. 45 illustrates a process for forming a thin silicide layer SS on the upper surface and the side surface of the fin FA. To form this thin silicide layer SS, the semiconductor substrate SB is arranged inside the sputtering apparatus. The semiconductor substrate SB is exposed to an inert gas atmosphere using argon (Ar), thereby removing a natural oxide film of approximately 1 to 3 nm which is attached to the upper surface and the side surface of the fin FA. Subsequently, in the same sputtering apparatus, a thermal process is performed for the semiconductor substrate SB. This thermal process is RTA (Rapid Thermal Annealing) at 200° C. for 90 seconds.

Then, after the thermal process and within 60 seconds, using a sputtering technique, a metal film MS1 is deposited on the main surface of the semiconductor substrate SB. The metal film MS1 is a film including Ni and Pt, and is formed from NiPt whose Pt concentration is 5 atom %. In this manner, the sputtering is performed, before a decrease in the temperature (for example, 200° C.) of the semiconductor substrate SB heated by the thermal process. If the metal film MS1 is formed using the sputtering technique for the semiconductor substrate SB at a high temperature, a part of the surface of the fin FA at a high temperature reacts with a part of the metal film MS1, and the thin silicide layer SS is formed to cover the side surface and the upper surface of the fin FA. The silicide layer SS includes, for example, NiSi (nickel silicide) and Pt (platinum). That is, the silicide layer SS is a NiPt silicide layer.

At this time, the metal film MS1 does not continuously cover the side surface and the upper surface of the fin FA, and the metal film MS1 covering the fin FA is divided into a plurality of parts. That is, the entire upper surface of the fin FA and the entire upper surface of the element isolation part STI are covered by the metal film MS1, while the side surface of the fin FA is covered partially by a plurality of columnar metal films MS1 extending in a direction vertical to the side surface of the fin FA. That is, the metal film MS1 covering the side surface of the fin FA is formed from a plurality of films (pattern) which are separated from each other in a direction along the side surface of the fin FA.

There are reasons why the metal film MS1 formed on the side surface of the fin FA has a columnar shape. That is, the metal film MS1 formed using the sputtering technique is hardly formed for the surface which has been formed at an angle nearly vertical to the main surface of the semiconductor substrate SB, like the side surface of the fin FA. In addition, the side surface of the fin FA is covered by the silicide layer SS. Because the columnar metal films MS1 formed on the side surface of the fin FA are separated from each other, the metal film MS1 may have some stress. Even if so, it is possible to prevent that the fin FA is influenced by stress.

The deposited metal film MS1 has a thickness of approximately 60 nm. Of the fin FA, the height of a part upper than the uppermost surface of the element isolation part STI is approximately 40 to 80 nm. The width of the direction "Y" of the fin FA is approximately 10 to 30 nm. In this embodiment, when the width in the direction "Y" of the fin FA is within the above range, if the metal film MS1 has a thickness of 60 nm, that is, if the thickness of the metal film MS1 is two to six times the width of the direction "Y" of the fin FA, the silicide layer S1 is formed as a full-silicide layer in the following process.

As illustrated in FIG. 46 and FIG. 47, the fin FA is full-silicided by performing the thermal process twice.

As illustrated in FIG. 46, in a first thermal process, RTA is performed at 240 to 300° C. for 35 to 60 seconds. Then, the metal film MS1 reacts with the upper surface and the side surface of the fin FA, resulting in forming the silicide layer MS2 mainly including $Ni_2Si$ (dinickel silicide). As a result, of the fin FA, 50% or more of the part upper than the uppermost surface of the element isolation part STI becomes the silicide layer MS2. To form this silicide layer MS2, the time and temperature of the first thermal process are adjusted, depending on the height and width of the fin FA. After this, a wet etching process is performed with using a chemical solution including sulfuric, thereby removing the unreacted metal film MS1.

As illustrated in FIG. 47, in a second thermal process, RTA is performed at 500° C. for 10 to 15 seconds. Then, the silicide layer MS2 reacts with the upper surface and the side surface of the fin FA, resulting in forming the silicide layer S1 mainly including NiSi (mononickel silicide). The silicide layer S1 is formed not only on the surface part of the fin FA, but also the inside of the fin, and has lower resistance than that of the silicide layer MS2. As a result, of the fin FA, 90% or more of the part upper than the uppermost surface of the element isolation part STI becomes the silicide layer S1. That is, the silicide layer S1 is formed in a manner that the part of the fin FA which is covered by the control gate electrode CG and the memory gate electrode MG is sandwiched in the direction "X".

As explained in FIG. 34, when carbon or nitrogen is introduced into the fin FA, it is possible to suppress overgrowth of the silicide layer S1.

In the region 1B and the region 1C, the fin FB, the fin FC, the epitaxial layer EP1, and the epitaxial layer EP2 are covered by the insulating film IF7 or the insulating film IF8. The metal film MS1 is deposited in the region 1B and the region 1C. Even if the above thermal process is performed, silicidation is not performed for the surface of each of the fins FB, FC, the epitaxial layer EP1, and the epitaxial layer EP2. The position of the uppermost surface of the silicide layer S1 is lower than the position of the uppermost surface of the epitaxial layers EP1 and EP2.

Figure 36:
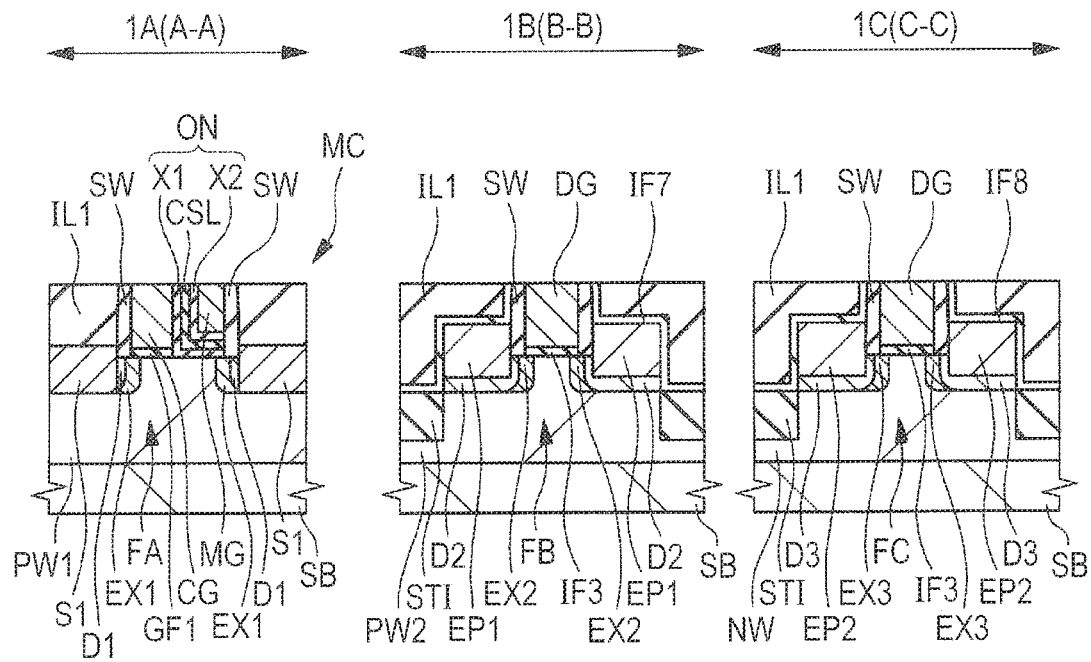
FIG. 36 is a cross sectional view for explaining a manufacturing process for the semiconductor device, after that of FIG. 35.

FIG. 36 illustrates a formation process for the interlayer insulating film IL1. There is formed the interlayer insulating film IL1 formed from, for example, a silicon oxide film on the semiconductor substrate SB, to cover the memory cell MC, the n-type transistor QN, and the p-type transistor QP, using the CVD technique. Next, the interlayer insulating film IL1 is polished using the CMP technique. This polishing process causes removal of the interlayer insulating film IL1, the insulating film IF4, and the insulating film IF5 formed which are formed on the control gate electrode CG, the memory gate electrode MG, and the dummy gate electrode DG. In this manner, the surface of each of the control gate electrode CG, the memory gate electrode MG, and the dummy gate electrode DG is exposed.

Before the interlayer insulating film IL1 is formed, a silicon nitride film may be formed on the semiconductor substrate SB, as an etching stopper.

Figure 37:
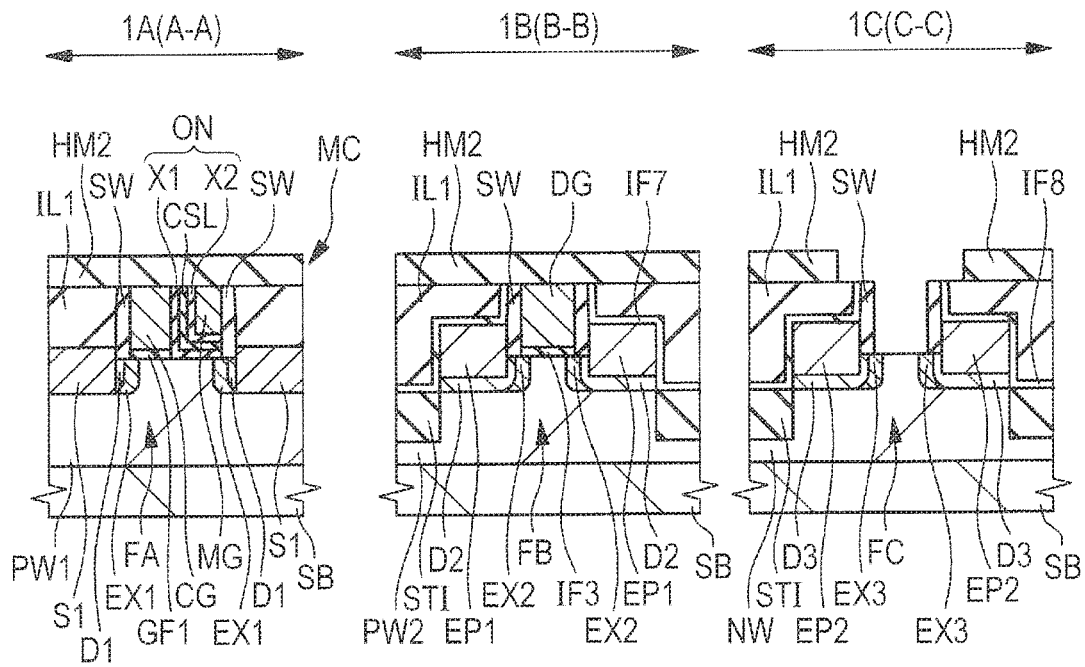
FIG. 37 is a cross sectional view for explaining a manufacturing process for the semiconductor device, after that of FIG. 36.

FIG. 37 illustrates a removal process for the dummy gate electrode DG exposed in the region 1C. After a hard mask HM2 is formed using, for example, the CVD technique on the semiconductor substrate SB, the hard mask HM2 of the region 1C is selectively removed using the photolithography technique and the etching technique, thereby exposing the dummy gate electrode DG of the region 1C. The hard mask HM2 is formed from, for example, a silicon oxide film or a TiN (titanium nitride) film.

Subsequently, in the region 1C, the dummy gate electrode DG exposed from the hard mask HM2 is removed using the wet etching technique. In this case, the insulating film IF3 below the dummy gate electrode DG is also removed, but it may possibly remain.

Figure 38:
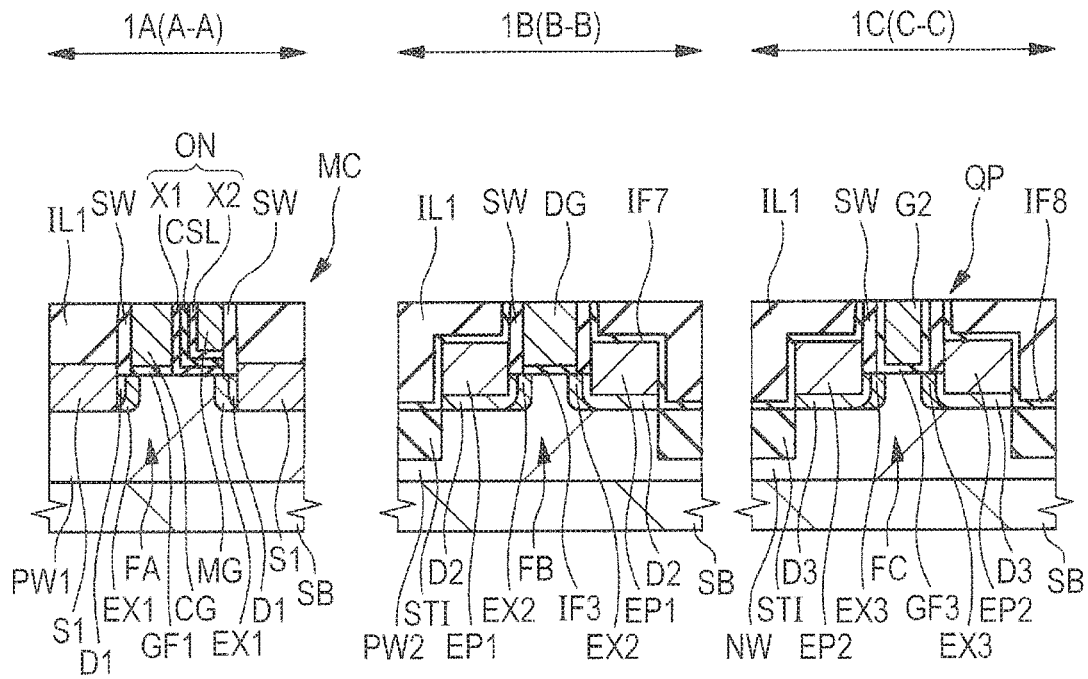
FIG. 38 is a cross sectional view for explaining a manufacturing process for the semiconductor device, after that of FIG. 37.

As illustrated in FIG. 38, in a trench from which the dummy gate electrode DG of the region 1C has been removed, the gate insulating film GF3 and the gate electrode G2 are formed. First, the gate insulating film GF3 is formed on the semiconductor substrate SB including the hard mask HM2, using, for example, the CVD technique or an ALD (Atomic Layer Deposition) technique. The gate insulating film GF3 is a high-k film having a dielectric constant greater than that of the silicon nitride film, and is a hafnium oxide film. The gate insulating film GF3 may be formed from a metal oxide film including a zirconium oxide film, an aluminum oxide film, or a tantalum oxide film, or a lantern oxide film.

A metal film to be the gate electrode G2 is formed on the gate insulating film GF3, using, for example, the sputtering technique. This metal film is formed from a single layered metal film including, for example, a tantalum nitride film, a titanium aluminum film, a titanium nitride film, a tungsten film, or an aluminum film, or a laminated film in which any of these films are appropriately laminated.

After this, the unnecessary gate insulating film GF3 and metal film on the hard mask HM2 are removed using, for example, the CMP technique, thereby forming the gate insulating film GF3 and the gate electrode G2 embedded in the trench from which the dummy gate electrode DG of the region 1C has been removed.

After this, the hard mask HM2 is removed using the wet etching process.

Figure 39:
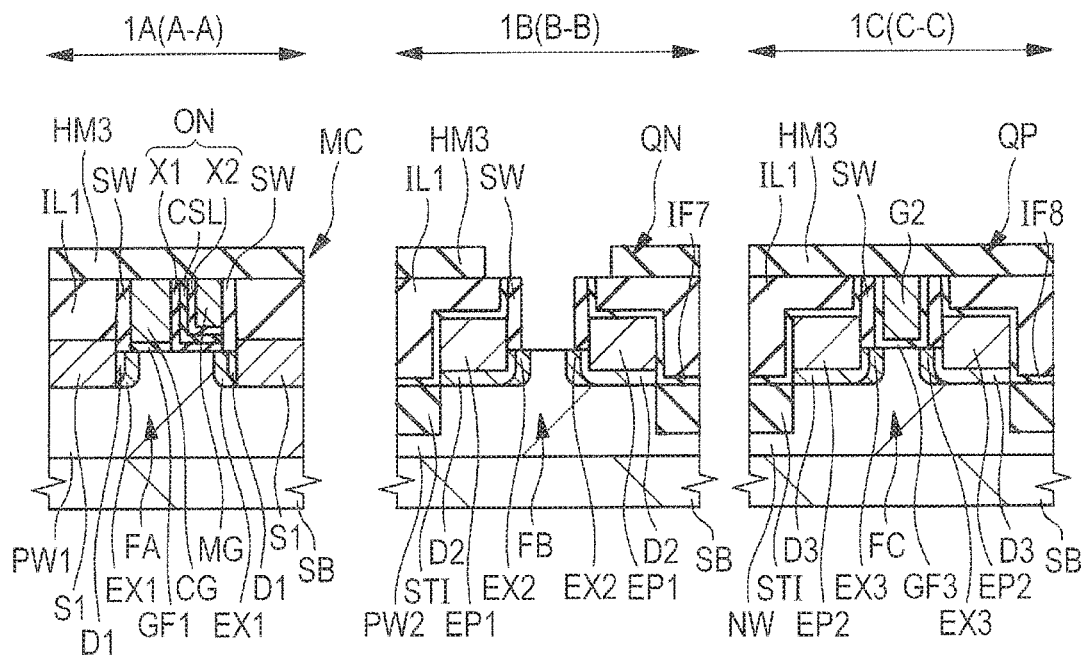
FIG. 39 is a cross sectional view for explaining a manufacturing process for the semiconductor device, after that of FIG. 38.

FIG. 39 illustrates a formation process for the dummy gate electrode DG exposed in the region 1B. First, after the hard mask HM3 is formed on the semiconductor substrate SB using, for example, the CVD technique, the hard mask HM3 of the region 1B is selectively removed using the photolithography technique and the etching technique, thereby exposing the dummy gate electrode DG of the region 1B. The hard mask HM3 is formed from, for example, a silicon oxide film or a TiN (titanium nitride) film.

In the region 1B, the dummy gate electrode DG exposed from the hard mask HM3 is removed using the wet etching technique. In this case, the insulating film IF3 below the dummy gate electrode DG is also removed, but it may possibly remain.

Figure 40:
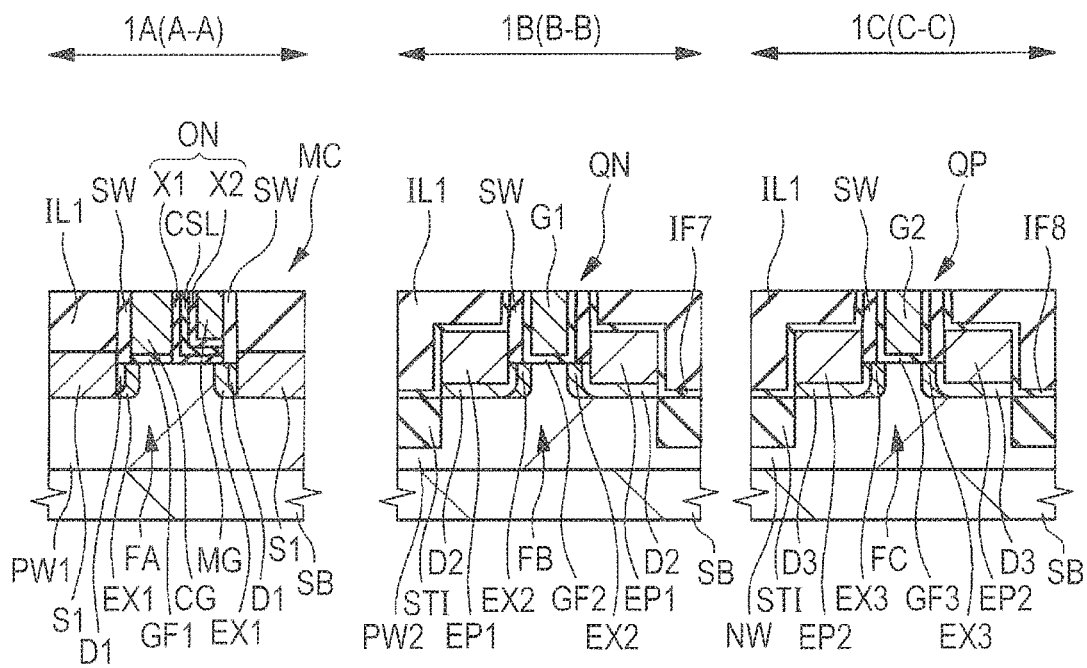
FIG. 40 is a cross sectional view for explaining a manufacturing process for the semiconductor device, after that of FIG. 39.

As illustrated in FIG. 40, the gate insulating film GF2 and the gate electrode G1 are formed in the trench from which the dummy gate electrode DG of the region 1B has been removed. The gate insulating film GF2 is formed on the semiconductor substrate SB including the hard mask HM3, using, for example, the CVD technique or the ALD technique. The gate insulating film GF2 is a high-k film having a dielectric constant greater than that of the silicon nitride film, and is formed from a hafnium oxide film. The gate insulating film GF2 may be formed from a metal oxide film including a zirconium oxide film, an aluminum oxide film, a tantalum oxide film, or a lantern oxide film.

Subsequently, a metal film to be the gate electrode G1 is formed on the gate insulating film GF2, using, for example, the sputtering technique. This metal film is formed from a single-layered metal film including, for example, a tantalum nitride film, a titanium aluminum film, a titanium nitride film, a tungsten film, or an aluminum film, or a laminated film in which any of these films are appropriately laminated.

After this, the unnecessary gate insulating film GF2 and metal film on the hard mask HM3 are removed, using, for example, the CMP technique, thereby forming the gate insulating film GF2 and the gate electrode G1 to be embedded in the trench from which the dummy gate electrode DG of the region 1B has been removed.

After this, the hard mask HM3 is removed using the wet etching process.

Figure 41:
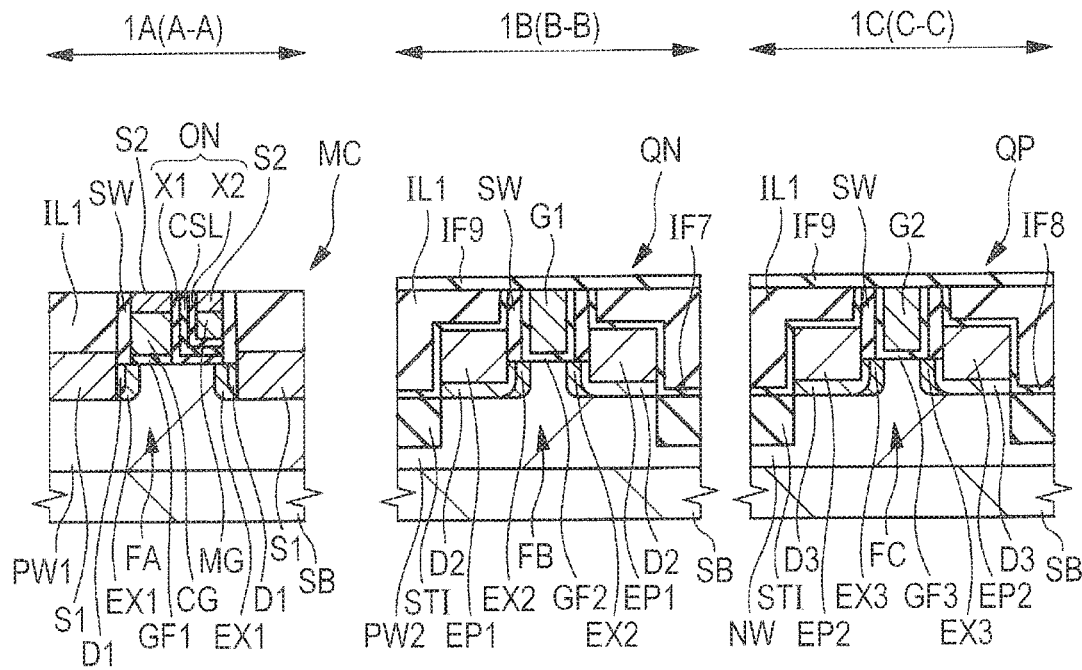
FIG. 41 is a cross sectional view for explaining a manufacturing process for the semiconductor device, after that of FIG. 40.

FIG. 41 illustrates a formation process for an insulating film IF9 and the silicide layer S2. After the insulating film IF9 is formed on the semiconductor substrate SB, using, for example, the CVD technique, the insulating film of the region 1A is selectively removed, using the photolithography technique and the etching technique. As a result, the gate electrode G1 of the region 1B and the gate electrode G2 of the region 1C are covered by the insulating film IF9.

Next, in the region 1A, the silicide layer S2 is formed on the control gate electrode CG exposed from the insulating film IF9 and the memory gate electrode MG. The silicide layer S2 is formed from, for example, nickel silicide (NiSi) or cobalt silicide ($CoSi_2$). Platinum (Pt) may be added to the silicide layer S2. According to the formation method for the silicide layer S2, a metal film is formed on the semiconductor substrate SB, and a thermal process is performed therefor. As a result, the metal film reacts with polycrystalline silicon of the control gate electrode CG and polycrystalline silicon of the memory gate electrode MG. After this, an unreacted metal film is removed using the wet etching technique, and a thermal process is performed again, thereby forming the silicide layer S2.

Figure 42:
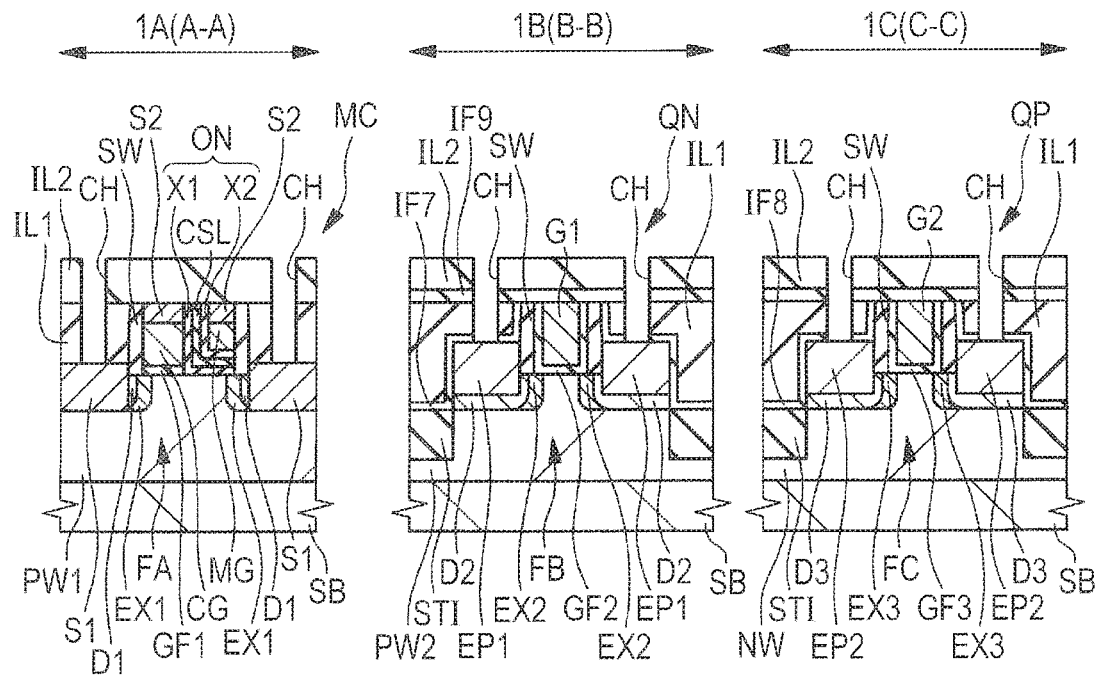
FIG. 42 is a cross sectional view for explaining a manufacturing process for the semiconductor device, after that of FIG. 41.

As illustrated in FIG. 42, the interlayer insulating film IL2 formed from, for example, a silicon oxide film is formed on the semiconductor substrate SB including the insulating film IF9, using, for example, the CVD technique. Then, the upper surface of the interlayer insulating film IL2 is planarized using, the CMP technique. A plurality of contact holes CH penetrating through the interlayer insulating films IL2 and IL1 are formed using the photolithography technique and the dry etching technique. The contact hole CH of each of the region 1B and the region 1C penetrates through the insulating film IL9.

In the region 1A, a part of the upper surface of the silicide layer S1 is exposed to the bottom part of the contact hole CH. In the region 1B, a part of the upper surface of the epitaxial layer EP1 (diffusion region D2) is exposed to the bottom part of the contact hole CH. In the region 1C, a part of the upper surface of the epitaxial layer EP2 (diffusion region D3) is exposed to the bottom part of the contact hole CH.

In a non-illustrative region, there are formed contact holes CH for exposing a part of the upper surfaces of the gate electrodes G1, G2, the control gate electrode CG, and the memory gate electrode MG. These contact holes CH do not penetrate through the interlayer insulating film IL1. In a direction vertical to the main surface of the semiconductor substrate SB, the length of the contact hole CH right above each of the epitaxial layers EP1 and EP2 is less than the length of the contact hole CH right above the silicide layer S1.

Figure 43:
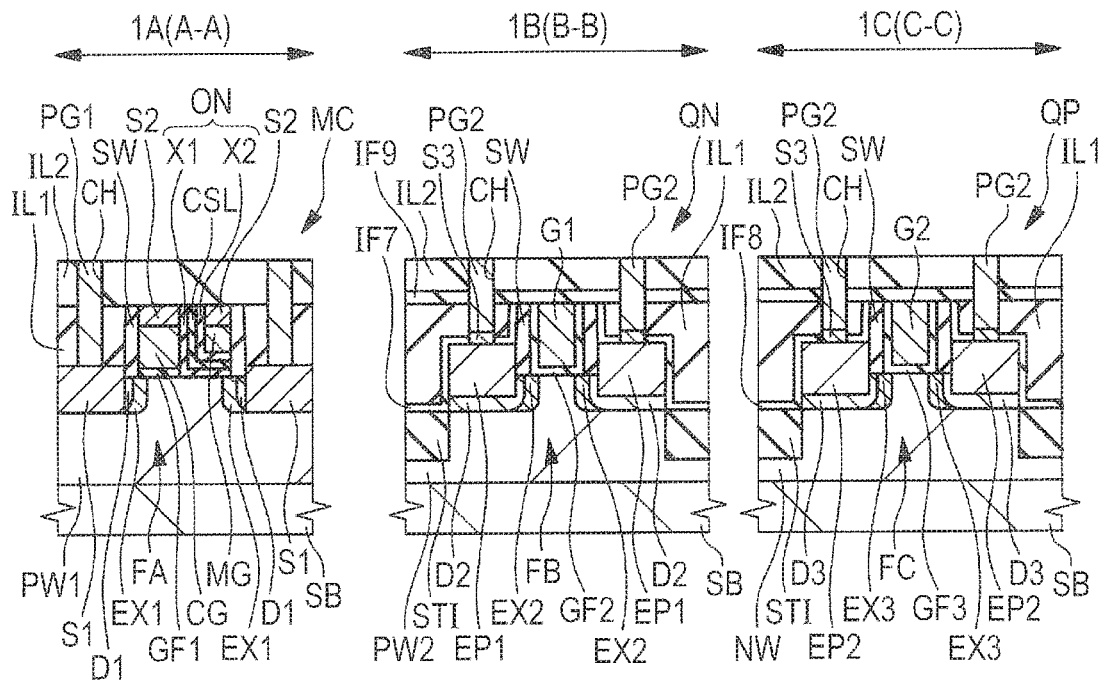
FIG. 43 is a cross sectional view for explaining a manufacturing process for the semiconductor device, after that of FIG. 42.

As illustrated in FIG. 43, the plug PG1 is formed in the contact hole CH of the region 1A, and the plug PG2 is formed in the contact hole CH of the region 1B and the region 1C. The plugs PG1 and PG2 have a laminated structure of a barrier metal film, including, for example, a titanium film and a titanium nitride film, and a conductive film including a tungsten film. The titanium film and the titanium nitride film are sequentially formed in the contact hole CH, using the CVD technique or the sputtering technique. The conductive film including the tungsten film is formed on the barrier metal film, using the CVD technique or the sputtering technique. The barrier metal film and the conductive film outside the contact hole are removed, using, for example, the CMP technique, thereby embedding the plugs PG1 and PG2 formed from the barrier metal film and the conductive film in the contact hole CH.

After this, a thermal process is performed for the semiconductor substrate SB. This causes reaction between the epitaxial layers EP1 and EP2 and the barrier metal film, in the region 1B and the region 1C, thereby forming the silicide layer S3. That is, the silicide layer S3 is formed of a TiSi$_2$ (titanium silicide) film.

In a direction vertical to the main surface of the semiconductor substrate SB, the length of the contact hole CH right above each of the epitaxial layers EP1 and EP2 is less than the length of the contact hole CH right above the silicide layer S1. This is because the height of the upper surface of the silicide layer S1 from the main surface of the semiconductor substrate SB is lower than the height of the upper surface of each of the epitaxial layers EP1 and EP2 from the main surface of the semiconductor substrate SB.

The height of the upper surface of each of the epitaxial layers EP1 and EP2 is greater than the height of the upper surface of the silicide layer S1. This is because if the epitaxial layers EP1 and EP2 are formed with a large volume, the resistance of each of the source region LS1, the drain region LD1, the source region LS2, and the drain region LD2 is reduced, in the n-type transistor QN and the p-type transistor QP.

The silicide layer S1 of the region 1A is formed from a material whose resistance is lower than that of the semiconductor layer. Thus, it is possible to sufficiently reduce the resistance of the source region MS and the drain region MD of the memory cell, even without the large volume or thickness.

The epitaxial layers EP1 and EP2 have resistance greater than that of the silicide layer S1. In the n-type transistor QN and the p-type transistor QP, to reduce the resistance of the source region LS1, the drain region LD1, the source region LS2, and the drain region LD2, they need a larger volume and a larger thickness than those of the silicide layer S1. Further, by forming the silicide layer S3 on the upper surface of each of the epitaxial layers EP1 and EP2, it is possible to reduce the resistance of each of the source region LS1, the drain region LD1, the source region LS2, and the drain region LD2, in the n-type transistor QN and the p-type transistor QP. In other words, in the n-type transistor QN and the p-type transistor QP, the silicide layer S3 is not full-silicided like the silicide layer S1, and the silicide layer S3 is formed only on the upper surface of each of the epitaxial layers EP1 and EP2.

Figure 44:
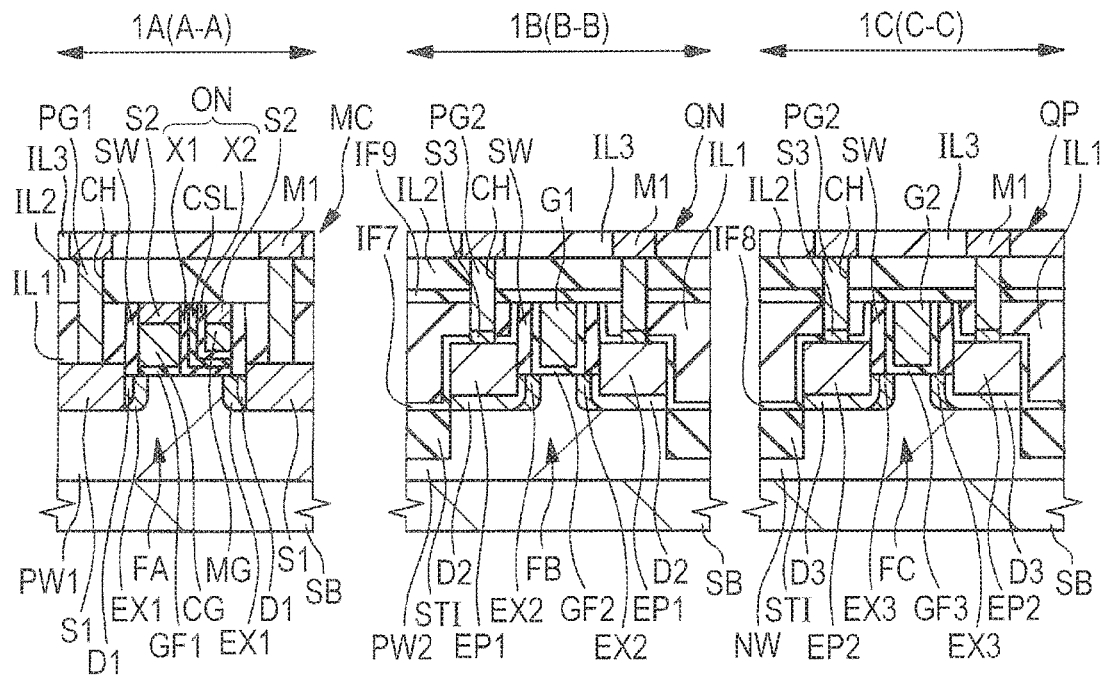
FIG. 44 is a cross sectional view for explaining a manufacturing process for the semiconductor device, after that of FIG. 43.

As illustrated in FIG. 44, there is formed, for example, the interlayer insulating film IL3 mainly including a silicon oxide film, using the CVD technique. Next, a trench for wiring is formed in the interlayer insulating film IL3. In this trench for wiring, a conductive film mainly including, for example, copper is embedded. As a result, there is formed the wiring M1 as the first layer which is coupled to the plugs PG1 and PG2 in the interlayer insulating film IL3.

Accordingly, the semiconductor device of this embodiment is manufactured.

Second Embodiment

Descriptions will hereinafter be made to a semiconductor device according to a second embodiment and its manufacturing method, using FIG. 51 and FIG. 52.

In the first embodiment, the metal film MS1 is deposited on the upper surface and the side surface of the fin FA, as described in FIG. 35 and FIG. 45 to FIG. 47. Then, the thermal process is performed twice, thereby the fin FA is full-silicided to form the silicide layer S1.

As the main feature of the second embodiment, the upper surface of the fin FA is retreated, thereafter growing a silicide layer S4 on the retreated fin FA, using the CVD technique.

Figure 51:
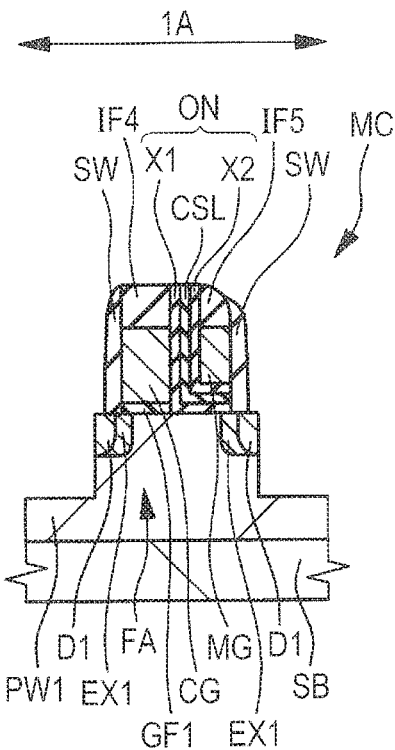
FIG. 51 is a cross sectional view for explaining a manufacturing process for a semiconductor device according to a second embodiment.
Figure 52:
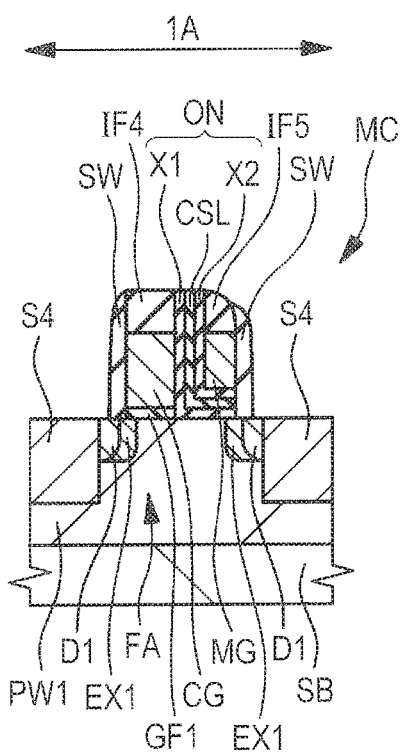
FIG. 52 is a cross sectional view for explaining a manufacturing process for a semiconductor device, after that of FIG. 51.

FIG. 51 and FIG. 52 illustrate a manufacturing process for a semiconductor device, after that of FIG. 34 of the first embodiment. In the second embodiment, any the regions other than the region 1A is the same as that of the first embodiment. Thus, descriptions will be made only to the region 1A.

As illustrated in FIG. 51, a dry etching process is selectively performed for the fin FA of the region 1A. By this process, the upper surface of the fin FA exposed from the sidewall spacer SW of the region 1A is retreated up to the height near the uppermost surface of the element isolation part STI. That is, of the fin FA, upper surfaces of two points are retreated to a position lower than the upper surface of the fin FA in which the control gate electrode CG and the memory gate electrode MG are formed. Note that these upper surfaces are formed in a manner that a part of the fin FA which is covered by the control gate electrode CG and the memory gate electrode MG is sandwiched therebetween in the direction "X".

At this time, in the region 1A, the upper surface and the side surface of the control gate electrode CG, and the upper surface and the side surface of the memory gate electrode are covered by each of the insulating sidewall spacer SW, the insulating film IF4, and the insulating film IF5. Further, as illustrated in FIG. 34, the regions 1B and 1C are covered by the insulating film IF7 or the insulating film IF8. Thus, the dry etching process for the fin FA can be performed by self-matching without providing any additional resist pattern.

The silicide layer S4 including NiSi$_2$ is epitaxially grown on the surface of the retreated fin FA, using the CVD technique. According to this CVD technique, a mixed gas of a gas including nickel (Ni) and a gas including silicon (Si) is used. The gas for use as this mixed gas may, for example, be a Ni (PF$_3$)$_4$ gas, a Si$_3$H$_8$ gas, and an H$_2$ gas. The film formation temperature in this CVD technique is 400 to 500° C.

This silicide layer S4 is grown on the surface of the fin FA from which silicon (Si) is exposed, and is not grown on the surface of the element isolation part STI including an insulating film. As illustrated in FIG. 34, the region 1B and the region 1C are covered by the insulating film IF7 or the insulating film IF8. Therefore, the silicide layer S4 is not formed in the region 1B and the region 1C.

After this, the same processes as those from FIG. 36 of the first embodiment are performed, thereby manufacturing the semiconductor device of the second embodiment.

Descriptions will now be made to the reason why the silicide layer S4 is epitaxially grown on the surface of the fin FA. Si included in the fin FA and NiSi$_2$ included in the silicide layer S4 form a cubic structure, a lattice constant of silicon (Si) is 5.430 Å, while a lattice constant of NiSi$_2$ is 5.406 Å. That is, Si and NiSi$_2$ form a cubit structure, and have approximately the equal lattice constant. Thus, in accordance with the above-described CVD technique, NiSi$_2$ is epitaxially grown on the surface of Si included in the fin FA. The film thickness of the silicide layer S4 can arbitrarily be set by adjusting the film formation time in accordance with the CVD technique. Thus, the thickness of the silicide layer S4 of the second embodiment may approximately be equal to the thickness of the silicide layer S1 of the first embodiment.

As described above, according to the second embodiment, it is possible to form the silicide layer S4 as the full silicide layer in each of the source region MS and the drain region MD of the memory cell. That is, of the fin FA, two silicide layers S4 are formed in a manner that the part covered by the control gate electrode CG and the memory gate electrode MG is sandwiched therebetween in the direction "X". Thus, the same effect as the first embodiment can be realized.

The silicide layer S4 may include CoSi$_2$ applied therefor, instead of NiSi$_2$. CoSi$_2$ also forms a cubit structure, and its lattice constant is 5.356 Å. Thus, the lattice constant of CoSi$_2$ is nearly equal to that of silicon (Si) which is 5.430 Å. Therefore, using the CVD technique, CoSi$_2$ is epitaxially grown on the surface of Si forming the fin FA.

The silicide layer S4 including NiSi$_2$ or CoSi$_2$ in the second embodiment has resistance greater than that of the silicide layer S1 including NiSi in the first embodiment. When it is intended to lower the resistance of the source region MS and the drain region MD of the memory cell MC, the semiconductor device of the first embodiment is preferred. However, the formation method for the silicide layer S4 of the second embodiment does not need any additional mask, and can be performed with a fewer number of processes than that of the first embodiment. Therefore, the manufacturing processes can be simplified, and when it is intended to suppress the manufacturing cost, the semiconductor device of the second embodiment is preferred.

Third Embodiment

Figure 53:
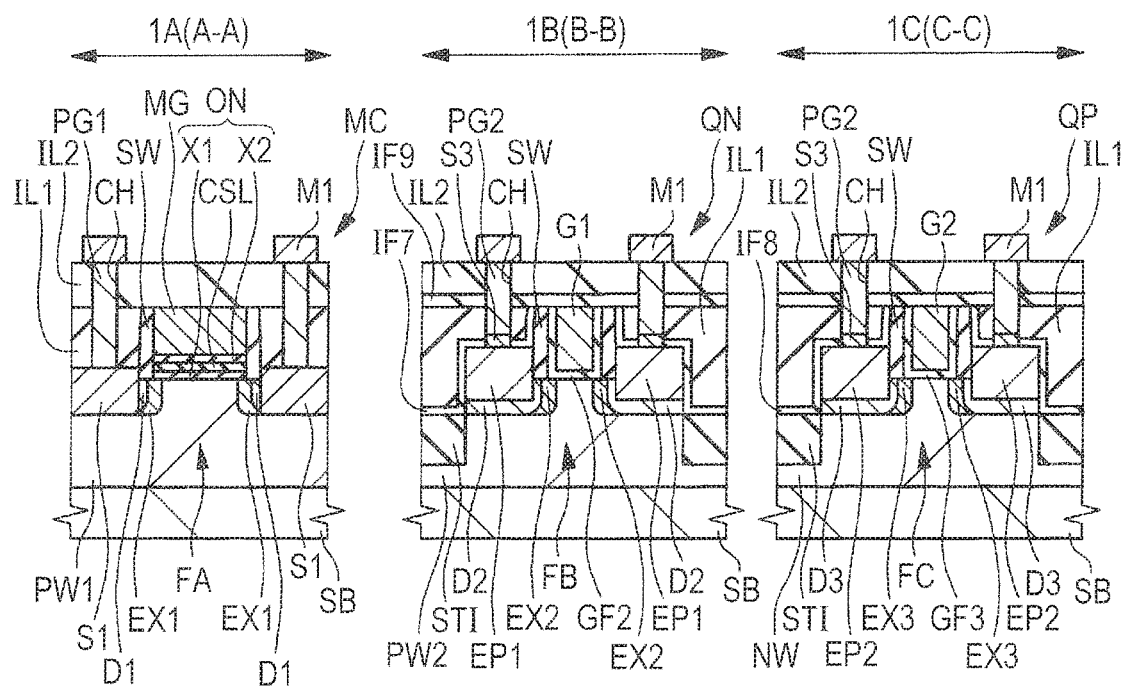
FIG. 53 is a cross sectional view for explaining a semiconductor device according to a third embodiment.

Descriptions will hereinafter be made to a semiconductor device according to a third embodiment and its manufacturing method, using FIG. 53.

In the first embodiment, as described in FIG. 4, the memory cell MC of the region 1A has the control gate electrode CG and the memory gate electrode MG.

In the third embodiment, the memory cell MC of the region 1A does not have the control gate electrode CG, and has a single gate structure having only the memory gate electrode MG.

The memory gate electrode MG of this memory cell can be formed by forming, for example, the insulating film ON explained in FIG. 21, and forming the insulating film S13 explained in FIG. 22 on this insulating film ON, thereafter patterning the conductive film S13 and the insulating film ON, without forming the control gate electrode CG formed from the conductive film SI2 in the region 1A.

In the third embodiment, like the first embodiment, the silicide layer S21 can be formed as a full-silicide layer. That is, two silicide layers S1 are formed in a manner that a part of the fin FA which is covered by the memory gate electrode MG is sandwiched therebetween in the direction "X". Thus, it is possible to lower the resistance of the source region MS and the drain region MD of the memory cell MC, and to improve the performance of the semiconductor device.

In the semiconductor device of the third embodiment, the technique explained in the second embodiment can be applied, and the same effect as that of the second embodiment can be realized.

The inventions by the present inventors have specifically been described based on the preferred embodiment. The present invention is not limited to the preferred embodiment, and various changes may be made without departing from the scope thereof.

What is claimed is:

1. A semiconductor device comprising:
    a first projecting unit which is a part of a semiconductor substrate, projects from an upper surface of the semiconductor substrate, and extends in a first direction along a main surface of the semiconductor substrate;
    a first gate electrode which extends in a second direction orthogonal to the first direction, and is formed to cover an upper surface and a side surface of a first part of the first projecting unit through a first gate insulating film; and
    a first silicide layer forming a part of a first source region and a second silicide layer forming a part of a first drain region which are formed in a manner that the first part is sandwiched therebetween in the first direction,
    wherein the first silicide layer forms 90% or more of the first source region, and
    wherein the second silicide layer forms 90% or more of the first drain region.

2. The semiconductor device according to claim 1,
    wherein the first source region includes a first semiconductor region formed in the first projecting unit, and
    wherein the first drain region includes a second semiconductor region formed in the first projecting unit,
    wherein the first semiconductor region is in a position closer to the first gate electrode than the first silicide layer, and
    wherein the second semiconductor region is in a position closer to the first gate electrode than the second silicide layer.

3. The semiconductor device according to claim 1, wherein each of the first silicide layer and the second silicide layer is formed from NiSi$_2$ or CoSi$_2$.

4. The semiconductor device according to claim 1, further comprising:
    a second projecting unit which is a part of the semiconductor substrate, projects from the upper surface of the semiconductor substrate, and extends in a first direction along a main surface of the semiconductor substrate;

a third gate electrode which extends in the second direction, and is formed to cover an upper surface and a side surface of a third part of the second projecting unit, through a third gate insulating film;
a first epitaxial layer which is formed to cover an upper surface and a side surface of a fourth part of the second projecting unit;
a second epitaxial layer which is formed to cover an upper surface and a side surface of a fifth part of the second projecting unit;
a third semiconductor region which is formed in the first epitaxial layer and in the fourth part;
a fourth semiconductor region which is formed in the second epitaxial layer and in the fifth part;
a third silicide layer which is formed over the first epitaxial layer; and
a fourth silicide layer which is formed over the second epitaxial layer,
wherein the fourth part and the fifth part are positioned in a manner that the third part is sandwiched therebetween in the first direction,
wherein the third semiconductor region forms a part of a second source region, and
wherein the fourth semiconductor region forms a part of a second drain region.

5. The semiconductor device according to claim 1, wherein each of the first silicide layer and the second silicide layer includes Ni and Si.

6. The semiconductor device according to claim 5, wherein each of the first silicide layer and the second silicide layer is formed from NiSi.

7. The semiconductor device according to claim 1,
wherein the first gate insulating film has a charge storage layer, and
wherein the first gate electrode, the first gate insulating film, the first source region, and the first drain region form a non-volatile memory cell.

8. The semiconductor device according to claim 7,
wherein the non-volatile memory cell further includes a second gate electrode extending in the second direction, and being formed to cover an upper surface and a side surface of a second part of the first projecting unit through a second gate insulating film,
wherein the second gate electrode is formed adjacent to the first gate electrode, and
wherein the first silicide layer and the second silicide layer are formed in a manner that the first part and the second part are sandwiched therebetween in the first direction.

9. The semiconductor device according to claim 8, wherein a writing operation for the non-volatile memory cell is performed in accordance with an SSI method.

10. A manufacturing method for a semiconductor device, comprising the steps of:
(a) retreating a part of an upper surface of a semiconductor substrate, thereby forming a first projecting unit which is a part of the semiconductor substrate, and projects from the retreated upper surface of the semiconductor substrate, and extends in a first direction along a main surface of the semiconductor substrate;
(b) forming a first gate electrode to extend in a second direction orthogonal to the first direction, and to cover an upper surface and a side surface of a first part of the first projecting unit through a first gate insulating film; and
(c) forming a first silicide layer forming a part of a first source region and a second silicide layer forming a part of a first drain region in a manner that the first part is sandwiched therebetween in the first direction,
wherein the first silicide layer forms 90% or more of the first source region, and
wherein the second silicide layer forms 90% or more of the first drain region.

11. The manufacturing method for a semiconductor device, according to claim 10,
wherein the step (c) includes the steps of
(c1) depositing a metal film over each of a second part of the first projecting unit and a third part of the first projecting unit between which the first part is sandwiched in the first direction, and
(c2) performing a thermal process for the metal film, thereby causing reaction between the metal film and the second part to form the first silicide layer, and causing reaction between the metal film and the third part to form the second silicide layer.

12. The manufacturing method for a semiconductor device, according to claim 11, wherein a thickness of the metal film deposited in the step (c1) is two to six times a width of the first projecting unit in the second direction.

13. The manufacturing method for a semiconductor device, according to claim 11, further comprising the step of introducing carbon or nitrogen into the second part and the third part using an ion implantation technique, after the step (b) and before the step (c1).

14. The manufacturing method for a semiconductor device, according to claim 11, wherein the metal film includes Ni and Pt.

15. The manufacturing method for a semiconductor device, according to claim 14, wherein each of the first silicide layer and the second silicide layer includes Ni and Si.

16. The manufacturing method for a semiconductor device, according to claim 10, wherein the step (c) includes the steps of
(c3) retreating a second part of the first projecting unit and a third part of the first projecting unit between which the first part is sandwiched in the first direction, to a position lower than an upper surface of the first part, and
(c4) forming the first silicide layer using a CVD technique over the retreated second part, and forming the second silicide layer using the CVD technique over the retreated third part.

17. The manufacturing method for a semiconductor device, according to claim 16, wherein each of the first silicide layer and the second silicide layer is formed from $NiSi_2$ or $CoSi_2$.

18. The manufacturing method for a semiconductor device, according to claim 16, further comprising the step of
(d) forming a first semiconductor region as a part of the first source region and a second semiconductor region as a part of the first drain region, in the first projecting unit using an ion implantation technique, after the step (b) and before the step (c),
wherein the first semiconductor region is in a position closer to the first gate electrode than the first silicide layer, and the second semiconductor region is in a position closer to the first gate electrode than the second silicide layer, after the step (c).

* * * * *